(12) United States Patent
Egawa

(10) Patent No.: US 9,287,302 B2
(45) Date of Patent: Mar. 15, 2016

(54) SOLID-STATE IMAGING DEVICE

(71) Applicant: Kabushiki Kaisha Toshiba, Minato-ku (JP)

(72) Inventor: Yoshitaka Egawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/455,273

(22) Filed: Aug. 8, 2014

(65) Prior Publication Data
US 2015/0162368 A1    Jun. 11, 2015

(30) Foreign Application Priority Data

Dec. 9, 2013 (JP) ................................. 2013-254038

(51) Int. Cl.
| H01L 27/00 | (2006.01) |
| H01L 31/0312 | (2006.01) |
| H01L 31/18 | (2006.01) |
| H01L 27/146 | (2006.01) |
| H04N 9/04 | (2006.01) |

(52) U.S. Cl.
CPC ...... *H01L 27/14603* (2013.01); *H01L 27/1461* (2013.01); *H01L 27/14621* (2013.01); *H01L 27/14625* (2013.01); *H01L 27/14627* (2013.01); *H01L 27/14641* (2013.01); *H01L 27/14665* (2013.01); *H04N 9/045* (2013.01)

(58) Field of Classification Search
CPC ............ H01L 31/0312; H01L 31/1812; H01L 27/1461; H01L 27/14627
USPC .................................................. 257/431–448
See application file for complete search history.

(56) References Cited

U.S. PATENT DOCUMENTS

| 5,965,875 | A | 10/1999 | Merrill et al. |
| 8,941,200 | B2 * | 1/2015 | Egawa .......................... 257/432 |
| 9,006,643 | B2 * | 4/2015 | Lin .......................... 250/227.24 |
| 2006/0215048 | A1 | 9/2006 | Suzuki |
| 2012/0286137 | A1 | 11/2012 | Yamaguchi |
| 2013/0307106 | A1 | 11/2013 | Egawa |
| 2014/0151837 | A1 * | 6/2014 | Ryu .............................. 257/432 |

FOREIGN PATENT DOCUMENTS

| CN | 101188245 | 5/2008 |
| JP | 2002-513145 | 5/2002 |
| JP | 2006-120773 | 5/2006 |
| JP | 2006-278446 | 10/2006 |
| JP | 2008-098476 | 4/2008 |

(Continued)

OTHER PUBLICATIONS

Office Action issued Nov. 20, 2015 in Taiwanese Patent Application No. 103126746 (with English language translation).

(Continued)

Primary Examiner — Cuong Q Nguyen
(74) Attorney, Agent, or Firm — Oblon, McClelland, Maier & Neustadt, L.L.P.

(57) ABSTRACT

According to one embodiment, pixels are divided by a grid set diagonally to a column direction, a green photoelectric conversion film is provided for each of the pixels and arranged to overlap a red photoelectric conversion layer in a depth direction, and a blue photoelectric conversion layer is arranged to be overlapped by the green photoelectric conversion film in a depth direction.

20 Claims, 24 Drawing Sheets

(56) References Cited

FOREIGN PATENT DOCUMENTS

| | | |
|---|---|---|
| JP | 2012-238648 | 12/2012 |
| JP | 2013-84785 | 5/2013 |
| JP | 2013-135122 | 7/2013 |
| JP | 2013-239634 | 11/2013 |
| KR | 10-2011-0010058 | 1/2011 |
| TW | 201004333 | 1/2010 |
| TW | 201130120 | 9/2011 |
| WO | WO 2013/100036 | 7/2013 |

OTHER PUBLICATIONS

Office Action issued Oct. 29, 2015, in Korean Patent Application No. 10-2014-0111299 (with English language translation).

* cited by examiner

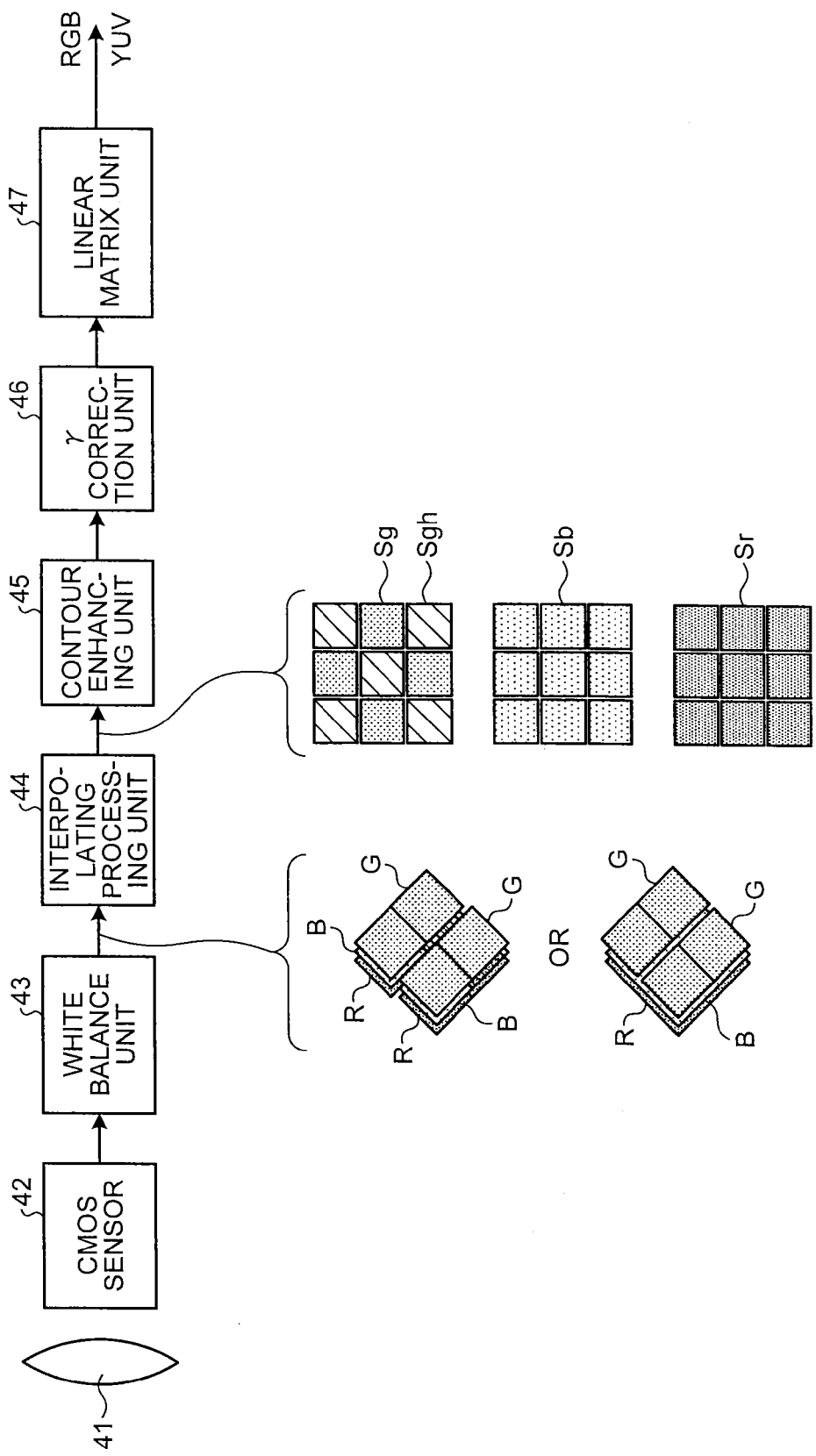

FIG.19A
FIG.19B
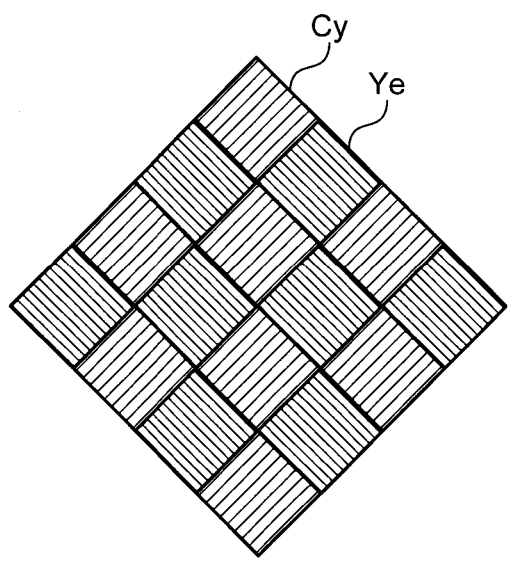
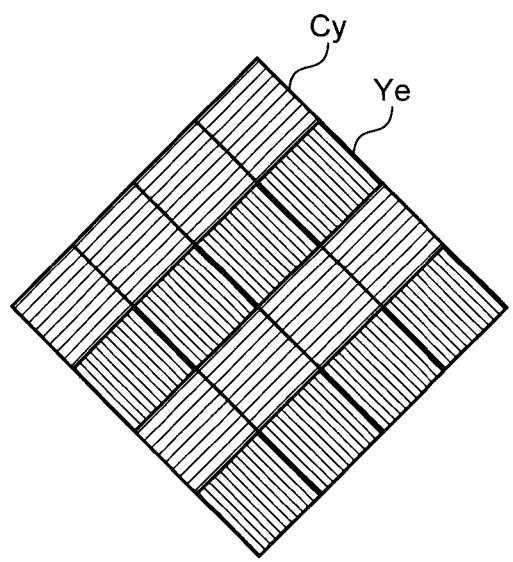

US 9,287,302 B2

SOLID-STATE IMAGING DEVICE

CROSS-REFERENCE TO RELATED APPLICATIONS

This application is based upon and claims the benefit of priority from Japanese Patent Application No. 2013-254038, filed on Dec. 9, 2013; the entire contents of which are incorporated herein by reference.

FIELD

Embodiments described herein relate generally to a solid-state imaging device.

BACKGROUND

Recently, thinner and higher resolution camera modules have been required to be installed on mobile phones or the like. According to such requirements of thinner and higher resolution camera modules, image sensors have come to include more miniaturized pixels. Since an amount of light to be entered into pixels of an image sensor decreases as a pixel area is smaller, a signal amount decreases and a signal-to-noise ratio (SNR) deteriorates. It is desired, therefore, to improve light utilization efficiency to realize an image sensor having high sensitivity.

BRIEF DESCRIPTION OF THE DRAWINGS

FIG. 18 is a block diagram schematically illustrating a solid-state imaging device according to a sixth embodiment;

FIG. 19A is a plan view illustrating an exemplary layout of a color filter of a solid-state imaging device according to a seventh embodiment. FIG. 19B is a plan view illustrating an alternative exemplary layout of the color filter of the solid-state imaging device according to the seventh embodiment;

DETAILED DESCRIPTION

According to an embodiment, a green photoelectric conversion film, a red photoelectric conversion layer, and a blue photoelectric conversion layer are provided as pixels. The pixels are divided by a grid that is diagonally set relative to a column direction. The green photoelectric conversion film is provided for each of the pixels. The green photoelectric conversion film and the red photoelectric conversion layer overlap each other in a depth direction. The blue photoelectric conversion layer is overlapped by the green photoelectric conversion film in a depth direction.

A solid-state imaging device according to embodiments will be described in detail below by referring to the attached drawings. The embodiments are not intended to limit the scope of the present invention.

(First Embodiment)

Figure 1:
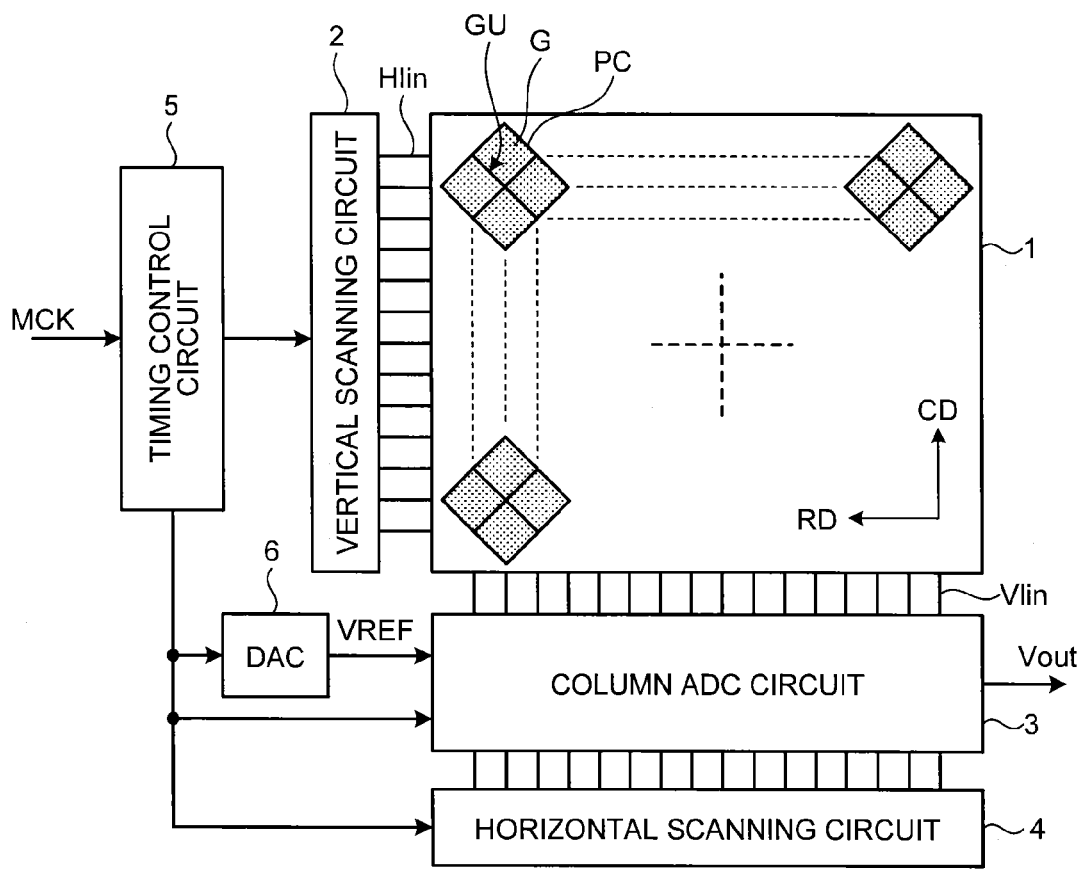
FIG. 1 is a block diagram schematically illustrating a solid-state imaging device according to a first embodiment.

FIG. 1 is a block diagram schematically illustrating a solid-state imaging device according to a first embodiment.

In FIG. 1, a solid-state imaging device includes a pixel array 1 arranged in a matrix of pixels PC that store photoelectrically converted electric charges in a row direction RD and a column direction CD, a vertical scanning circuit 2 configured to vertically scan the pixels PC to be read, a column ADC circuit 3 configured to detect a signal component of each pixel PC by CDS, a horizontal scanning circuit 4 configured to horizontally scan the pixels PC to be read, a timing control circuit 5 configured to control timing to read and store each pixel PC, and a reference voltage generating circuit 6 configured to output a reference voltage VREF to the column ADC circuit 3. The timing control circuit 5 receives a master clock MCK.

The pixel array 1 includes a horizontal control line Hlin provided in the row direction RD to control reading of the pixels PC, and a vertical control line Vlin provided in the column direction CD to transfer signals read from the pixels PC.

The pixels PC are divided by a grid GU that is set diagonally to the column direction CD. Each pixel PC is provided with a green photoelectric conversion film G. The green photoelectric conversion film G can be arranged on the entire surface of the pixel array 1. The grid GU may be set at an inclination angle of 45 degrees relative to the column direction CD. At this time, the pixels PC can be arranged two-dimensionally by shifting each line of the pixels PC by ½ pixel. The red photoelectric conversion layer and the blue photoelectric conversion layer are arranged to be overlapped by the green photoelectric conversion film G in a depth direction for the pixel PC. The green photoelectric conversion film G may be made of an inorganic or organic material that mainly has sensitivity to green. An organic photoelectric material that absorbs green light and is transparent to red light and blue light may be a material such as a perylene-based compound, a quinacridone-based compound, Rhodamine 6G, etc. To collect photoelectrically converted electric charges by the green photoelectric conversion film G, a transparent electrode may be provided on and below the green photoelectric conversion film G. An organic photoelectric film may be formed by vacuum vapor deposition, and the transparent electrode may be formed by sputtering. The red photoelectric conversion layer and the blue photoelectric conversion layer may be formed by a semiconductor material such as Si.

The vertical scanning circuit 2 vertically scans the pixels PC to select a pixel PC in the row direction, and a signal read from the selected pixel PC is sent to the column ADC circuit 3 via the vertical signal line Vlin. A signal level of the signal read from the pixel PC is compared to a reference signal level to determine a difference, and a signal component of each pixel PC is detected for each column by CDS and output as an output signal Vout.

Since the pixels PC have been arranged two-dimensionally by shifting each line by ½ pixel, pixel signals are generated at 0.5 pitch in both horizontal and vertical directions by interpolating signals among the pixels PC according to the pixel signals obtained from the green photoelectric conversion film G, which leads to improvement of resolution.

Figure 2A:
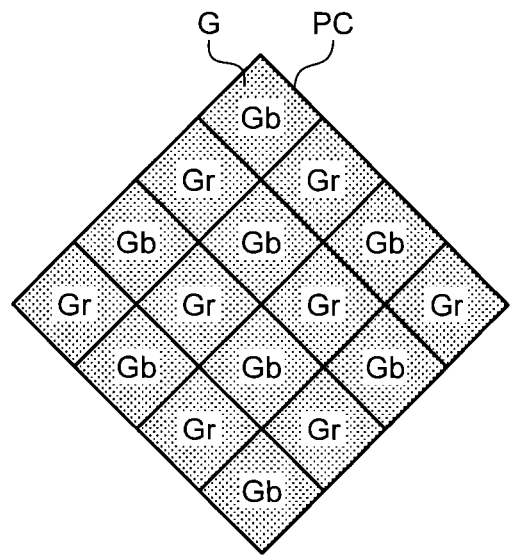
FIG. 2A is a plan view illustrating an exemplary layout of a green photoelectric conversion film of the solid-state imaging device according to the first embodiment.
Figure 2B:
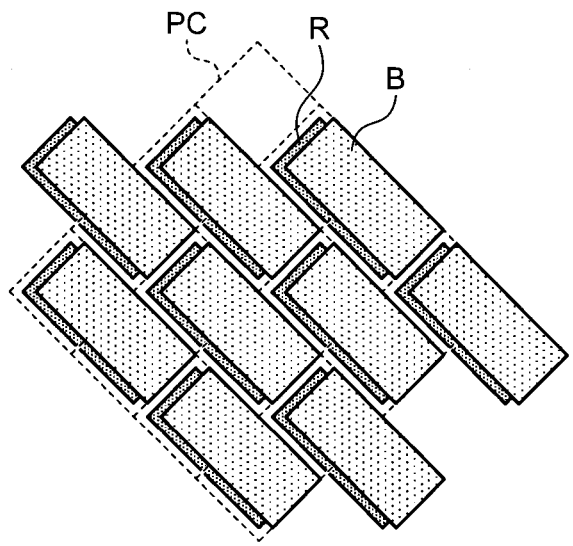
FIG. 2B is a plan view illustrating an exemplary layout of a red photoelectric conversion layer and a blue photoelectric conversion layer of the solid-state imaging device according to the first embodiment.
Figure 2C:
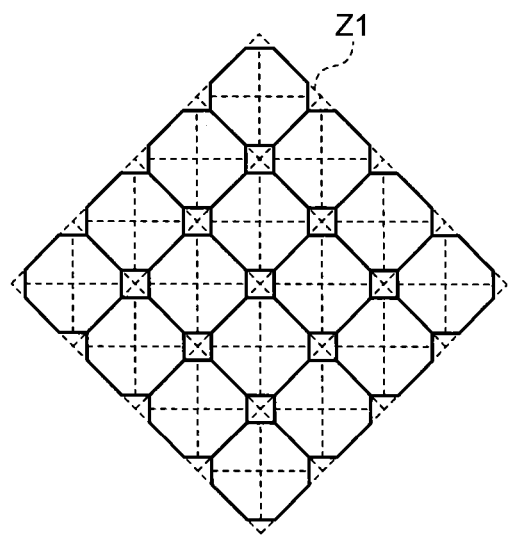
FIG. 2C is a plan view illustrating an exemplary layout of a microlens of the solid-state imaging device according to the first embodiment.

FIG. 2A is a plan view illustrating an exemplary layout of a green photoelectric conversion film of the solid-state imaging device according to the first embodiment. FIG. 2B is a plan view illustrating an exemplary layout of a red photoelectric conversion layer and a blue photoelectric conversion layer of the solid-state imaging device according to the first embodiment. FIG. 2C is a plan view illustrating an exemplary layout of a microlens of the solid-state imaging device according to the first embodiment.

In FIG. 2A, green photoelectric conversion films Gr, Gb are provided as the green photoelectric conversion films G for each pixel PC. At this time, the green photoelectric conversion film G may cover the entire pixels PC.

In FIG. 2B, the red photoelectric conversion layer R and the blue photoelectric conversion layer B are arranged to be overlapped by the green photoelectric conversion film G in a depth direction for the pixel PC. At this time, the red photoelectric conversion layer R and the blue photoelectric conversion layer B may overlap each other to spread over two pixels.

In FIG. 2C, a microlens Z1 may be provided for each pixel PC. The microlens Z1 may be arranged on the green photoelectric conversion film G. To increase light collecting efficiency, it is preferable to match the center of each microlens Z1 with the center of each pixel PC. The microlens Z1 may not be provided.

Since the red photoelectric conversion layer R and the blue photoelectric conversion layer B have overlapped each other to spread over two pixels, the sensitivity to red and blue can be increased four times higher than that of a single layered Bayer arrangement. Since the green photoelectric conversion film G has been arranged to overlap the red photoelectric conversion layer R and blue photoelectric conversion layer B in a depth direction, color mixture can be reduced and the size of the green pixel can be twice as large as that of the single layered Bayer arrangement. As a result, the quantity of incident light can be doubled, and the sensitivity can also be doubled. In addition, the signals among the pixels PC have been interpolated according to the pixel signals obtained from the green photoelectric conversion film G, the resolution equivalent to that of the single layered Bayer arrangement can be obtained.

Figure 3:
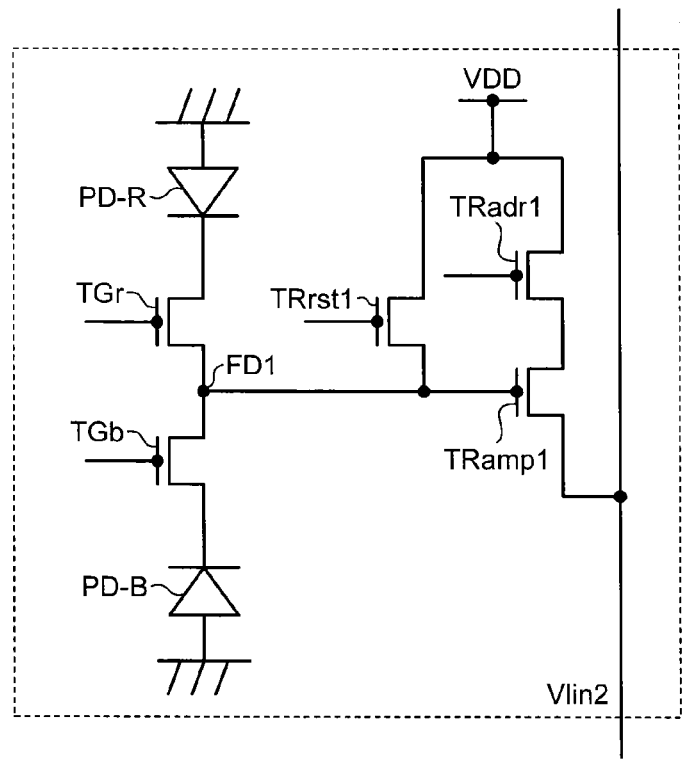
FIG. 3 is a circuit diagram illustrating a two-pixels-for-a-cell structure of the red photoelectric conversion layer and the blue photoelectric conversion layer of FIG. 2B.

FIG. 3 is a circuit diagram illustrating a two-pixels-for-a-cell structure of the red photoelectric conversion layer and the blue photoelectric conversion layer of FIG. 2B.

In FIG. 3, a cell includes photo diodes PD-B, PD-R, a row selecting transistor TRadr1, an amplifying transistor TRamp1, a reset transistor TRrst1, and read-out transistors TGb, TGr. Floating diffusion FD1 is formed as a detection node at a joint of the amplifying transistor TRamp1, the reset transistor TRrst1, and the read-out transistors TGb, TGr. The floating diffusion FD1, the row selecting transistor TRadr1, the amplifying transistor TRamp1, and the reset transistor TRrst1 are used as an output circuit and shared by the photo diodes PD-B, PD-R.

The read-out transistor TGr has its source connected to the photo diode PD-R, and the read-out transistor TGb has its source connected to the photo diode PD-B. The reset transistor TRrst1 has its source connected to the drains of the read-out transistors TGb, TGr, and the drains of the reset transistors TRrst1 and the row selecting transistor TRadr1 are connected to power supply potential VDD. The amplifying transistor TRamp1 has its source connected to a vertical signal line Vlin2, its gate connected to the drains of the read-out transistors TGb, TGr, and its drain connected to the source of the row selecting transistor TRadr1.

Figure 4:
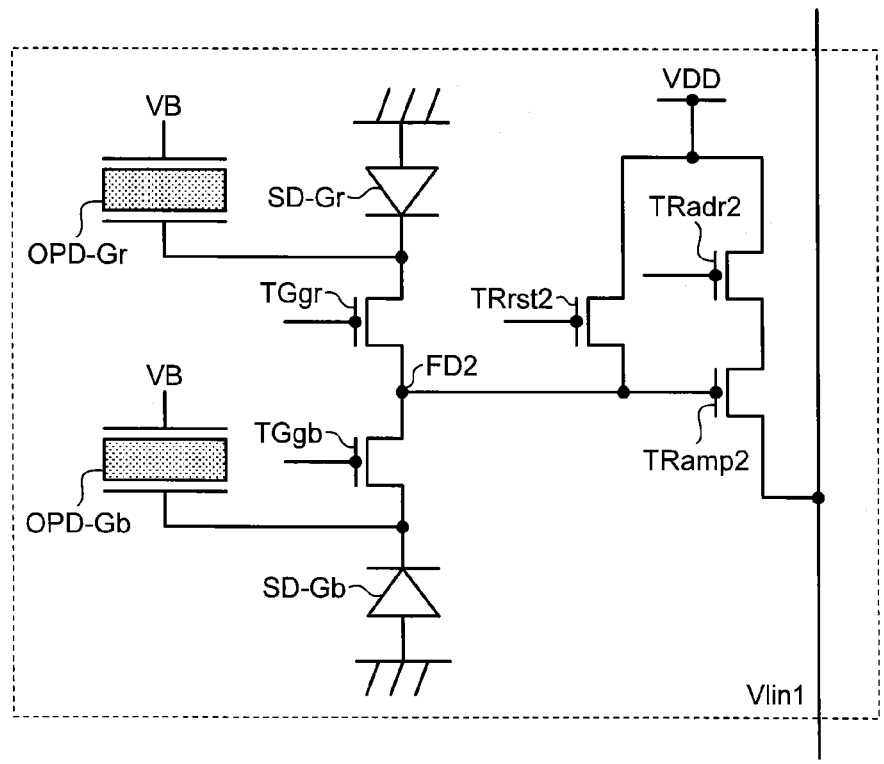
FIG. 4 is a circuit diagram illustrating the two-pixels-for-a-cell structure of the green photoelectric conversion film of FIG. 2A.

FIG. 4 is a circuit diagram illustrating the two-pixels-for-a-cell structure of the green photoelectric conversion film of FIG. 2A.

In FIG. 4, a cell includes photoelectric conversion devices OPD-Gr, OPD-Gb, storage diodes SD-Gr, SD-Gb, a row selecting transistor TRadr2, an amplifying transistor TRamp2, a reset transistor TRrst2, and read-out transistors TGgr, TGgb. A floating diffusion FD2 is formed as a detection node at a joint of the amplifying transistor TRamp2, the reset transistor TRrst2, and the read-out transistors TGgr, TGgb. The floating diffusion FD2, the row selecting transistor TRadr2, the amplifying transistor TRamp2, and the reset transistor TRrst2 are used as an output circuit and shared by the photoelectric conversion devices OPD-Gr, OPD-Gb.

The read-out transistor TGgr has its source connected to the storage diode SD-Gr and the photoelectric conversion device OPD-Gr, and the read-out transistor TGgb has its source connected to the storage diode SD-Gb and the photoelectric conversion device OPD-Gb. The photoelectric conversion devices OPD-Gr, OPD-Gb may be formed by a transparent electrode such as ITO on and below the photoelectric conversion film. The reset transistor TRrst2 has its source connected to the drain of the read-out transistors TGgr, TGgb, and the drains of the reset transistor TRrst2 and the row selecting transistor TRadr2 are connected to power supply potential VDD. The amplifying transistor TRamp2 has its source connected to the vertical signal line Vlin1, its gate connected to the drains of the read-out transistors TGgr, TGgb, and its drain connected to the source of the row selecting transistor TRadr2. A bias voltage VB is applied to the photoelectric conversion devices OPD-Gr, OPD-Gb.

Figure 5:
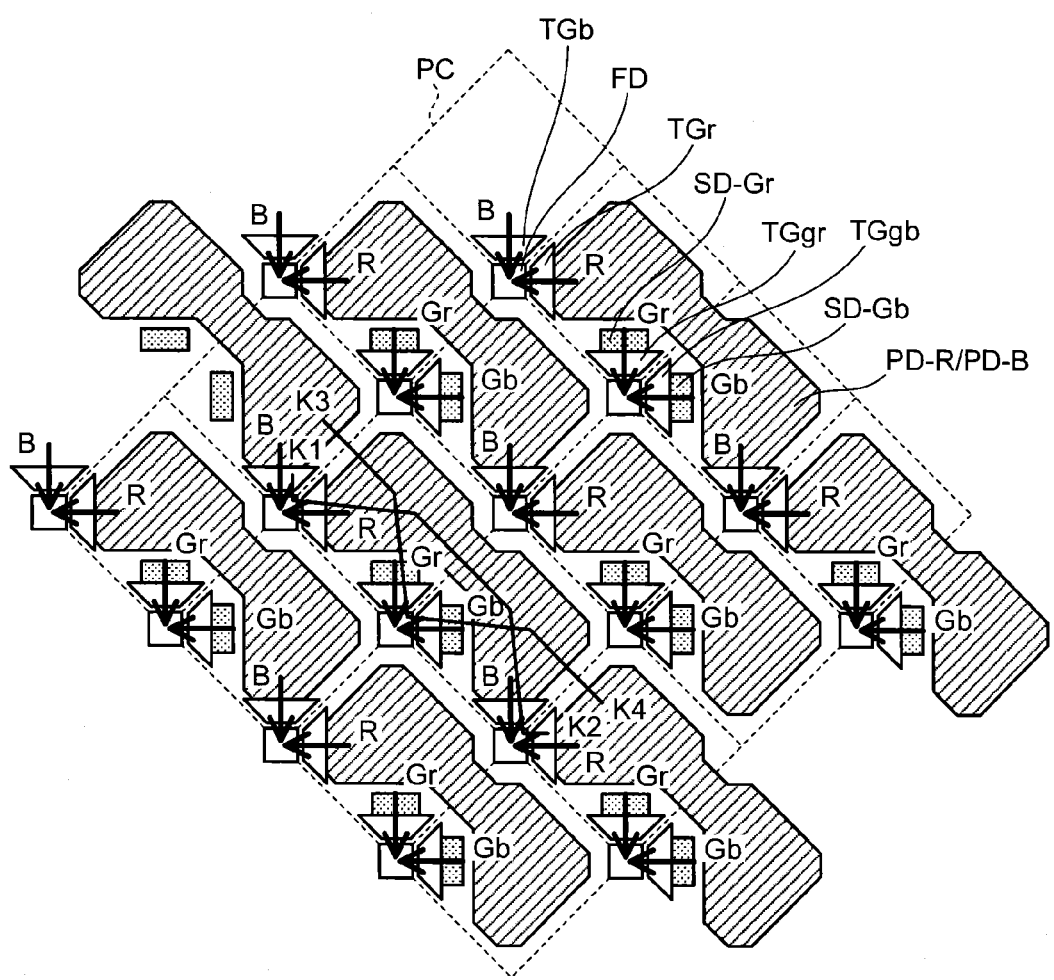
FIG. 5 is a plan view illustrating an exemplary layout of photo diodes, floating diffusion, and gate electrodes of the solid-state imaging device according to the first embodiment.

FIG. 5 is a plan view illustrating an exemplary layout of the photo diodes, the floating diffusion, and the gate electrodes of the solid-state imaging device according to the first embodiment.

In FIG. 5, the photo diode PD-R is provided in the red photoelectric conversion layer, and the photo diode PD-B is provided in the blue photoelectric conversion layer. The photo diodes PD-R and PD-B overlap each other in a depth direction to spread over two pixels. The storage diodes S-Gr, S-Gb are provided corresponding to the green photoelectric conversion films Gr, Gb, respectively, for each pixel PC. The storage diodes SD-Gr, SD-Gb may be arranged adjacent to each other. To secure space for arranging the storage diodes SD-Gr, SD-Gb, a width of the center part of the photo diodes PD-R, PD-B may be narrower.

The gate electrodes TGr, TGb are provided corresponding to the photo diodes PD-R, PD-B, respectively, and the gate electrodes TGgr, TGgb are provided corresponding to the storage diodes SD-Gr, SD-Gb. A first floating diffusion FD is shared by the gate electrodes TGr, TGb, while a second floating diffusion FD is shared by gate electrodes TGgr, TGgb.

Figure 6:
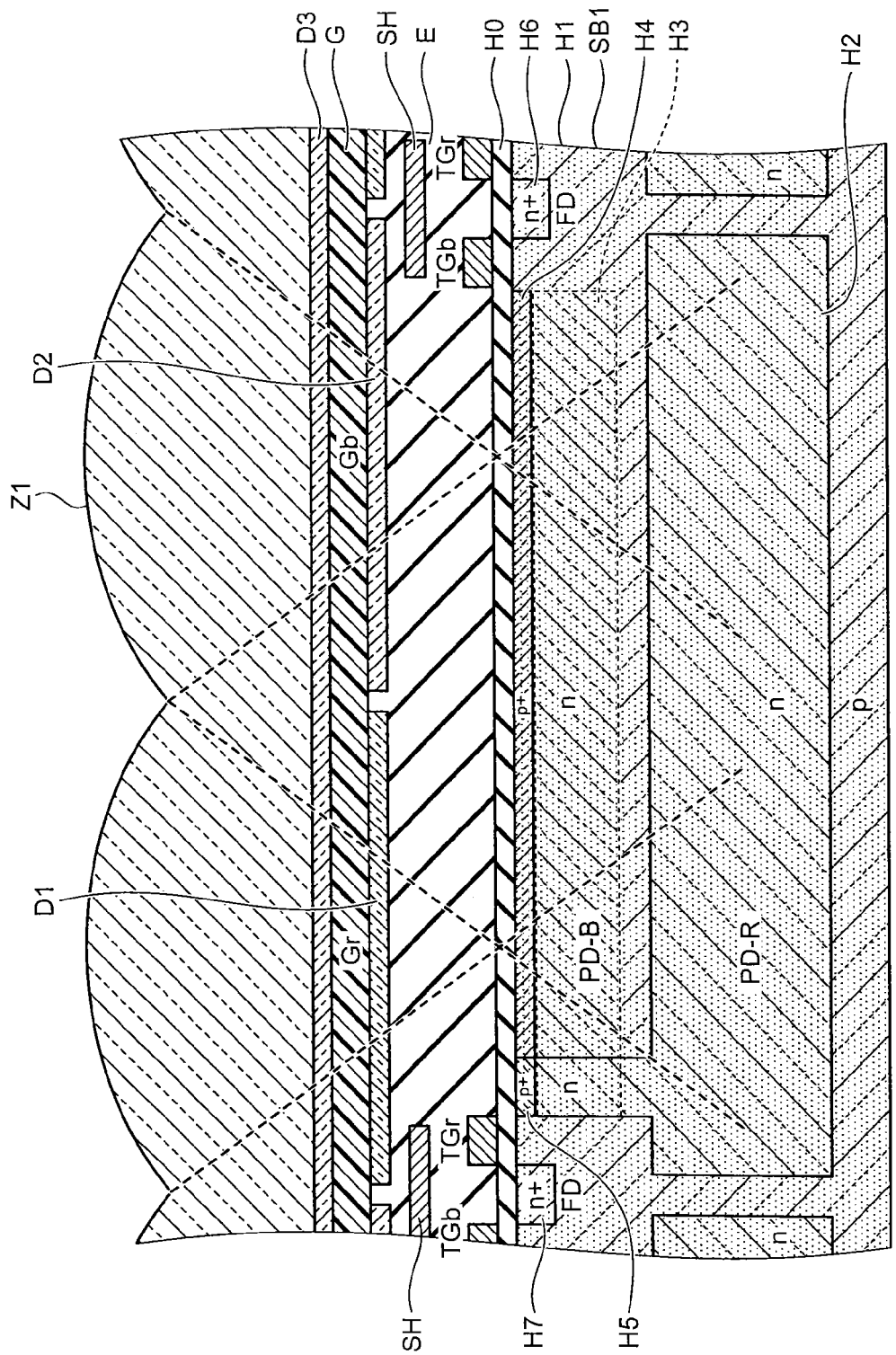
FIG. 6 is a cross-sectional view schematically illustrating a structure of the solid-state imaging device of FIG. 5 when cut along line K1-K2.

FIG. 6 is a cross-sectional view schematically illustrating a structure of the solid-state imaging device of FIG. 5 when cut along line K1-K2. FIG. 6 exemplarily illustrates a front side irradiation type CMOS sensor.

In FIG. 6, an impurity diffusion layer H1 is formed in a semiconductor layer SB1, and a gate insulating film H0 is formed on the front side of the impurity diffusion layer H1. The gate insulating film H0 may be formed by a silicon oxide film. At the photo diode PD-B, an impurity diffusion layer H3 is formed in the semiconductor layer SB1, and an impurity diffusion layer H4 is formed on the front side of the impurity diffusion layer H3. At the photo diode PD-R, an impurity diffusion layer H2 is formed in the semiconductor layer SB1. The impurity diffusion layer H2 is arranged below the impurity diffusion layer H3, and extracted to the front side of the semiconductor layer SB1 by passing through the side of the impurity diffusion layer H3. An impurity diffusion layer H5 is formed on the extracted part of the impurity diffusion layer H2. On the front side of the semiconductor layer SB1, an impurity diffusion layer H6 is formed between the extracted part of the impurity diffusion layer H2 and the impurity diffusion layer H3 as floating diffusion FD. The impurity diffusion layer H1 may be set as a p-type layer. The impurity diffusion layers H2, H3 may be set as n-type layers. The impurity diffusion layers H4, H5 may be set as $p^+$-type layers. The impurity diffusion layer H6 may be set as an $n^+$-type layer.

On the front side of the semiconductor layer SB1, the gate electrode TGb is arranged on the impurity diffusion layer H1 between the impurity diffusion layers H4 and H6, and the gate electrode TGr is arranged on the impurity diffusion layer H1 between the impurity diffusion layers H5 and H6. A light shielding film SH is buried in an interlayer insulating film E on the gate electrodes TGb, TGr and the impurity diffusion layer H6. The light shielding film SH may be formed by resin such as a carbon-containing resin, or metal such as Al or tungsten. The green photoelectric conversion film G is formed on the interlayer insulating film E to cover the entire surface of the semiconductor layer SB1. On the underside of the green photoelectric conversion film G, transparent electrodes D1, D2 are provided for the green photoelectric conversion films Gr, Gb, respectively, and a transparent electrode D3 is formed on the top surface of the green photoelectric conversion film G. A microlens Z1 is arranged for each pixel PC on the transparent electrode D3.

Light is collected by the microlens Z1 and reaches the semiconductor layer SB1 where the photo diode PD-B absorbs blue light and the photo diode PD-R absorbs red light. The photo diode PD-B photoelectrically converts the blue light to generate electric charges, and the obtained electric charges are stored in the photo diode PD-B. At the same time, the photo diode PD-R photoelectrically converts the red light to generate electric charges, and the obtained electric charges are stored in the photo diode PD-R. A read-out voltage is applied to the gate electrode TGb, and the electric charges stored in the photo diode PD-B are read and transferred into the floating diffusion FD. A read-out voltage is applied to the gate electrode TGr, and the electric charges stored in the photo diode PD-R are read and transferred into the floating diffusion FD.

Since the photo diodes PD-R, PD-B have overlapped each other to spread over two pixels, the sensitivity to red and blue can be increased four times higher than that of a single layered Bayer arrangement.

Figure 7:
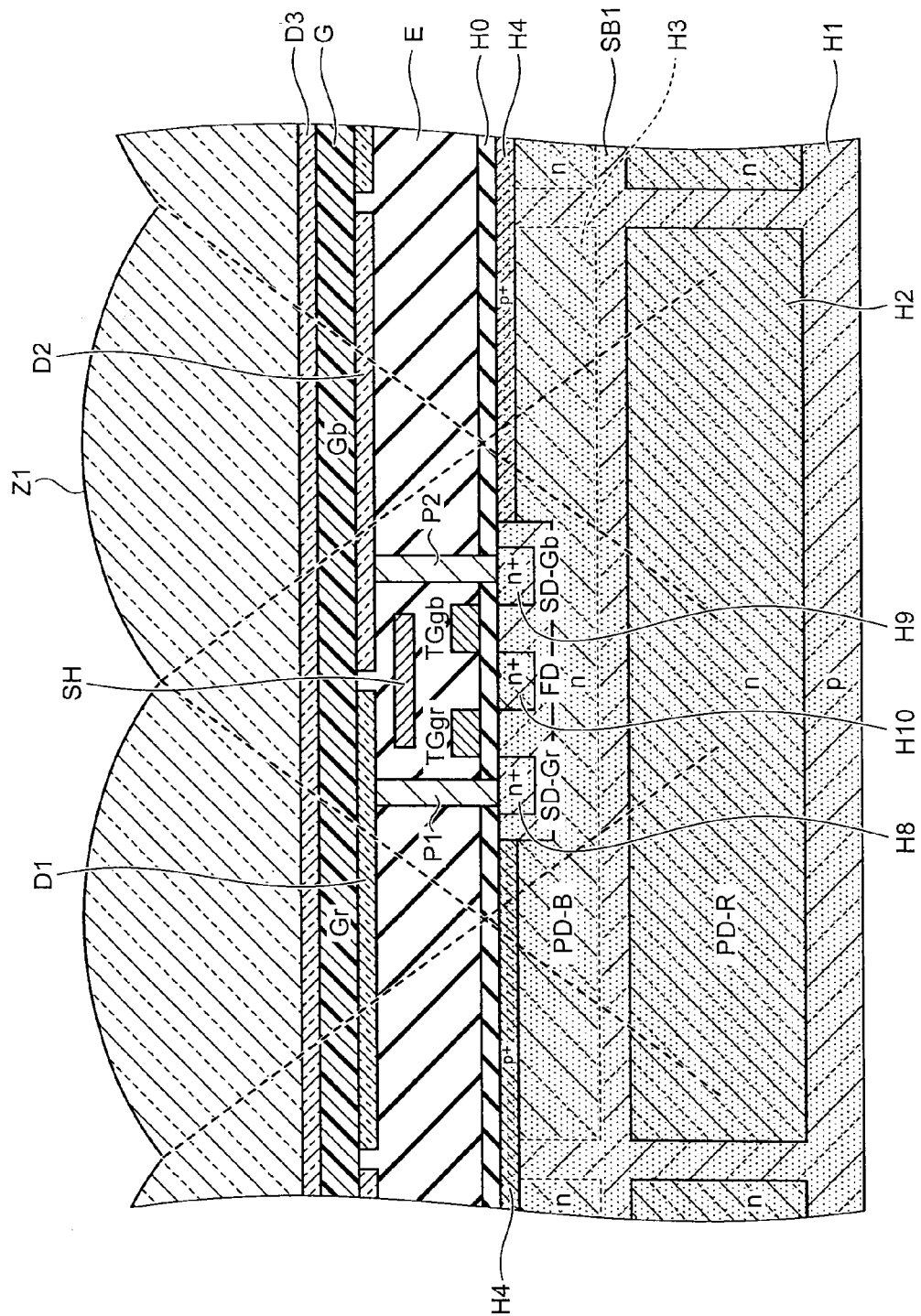
FIG. 7 is a cross-sectional view schematically illustrating a structure of a solid-state imaging device of FIG. 5 when cut along line K3-K4.

FIG. 7 is a cross-sectional view schematically illustrating a structure of a solid-state imaging device of FIG. 5 when cut along line K3-K4. FIG. 7 exemplarily illustrates a front side irradiation type CMOS sensor.

In FIG. 7, the impurity diffusion layer H1 is formed in the semiconductor layer SB1, and the gate insulating film H0 is formed on the front side of the impurity diffusion layer H1. At the photo diode PD-B, an impurity diffusion layer H3 is formed in the semiconductor layer SB1, and an impurity diffusion layer H4 is formed on the front side of the impurity diffusion layer H3. At the photo diode PD-R, an impurity diffusion layer H2 is formed in the semiconductor layer SB1. On the front side of the semiconductor layer SB1, impurity diffusion layers H8, H9 are formed in the center of the photo diode PD-B as the storage diodes SD-Gr, SD-Gb, respectively. On the front side of the semiconductor layer SB1, the impurity diffusion layer H10 is formed between the impurity diffusion layers H8, H9 as the floating diffusion FD. The impurity diffusion layers H8, H9, H10 may be set as $n^+$-type layers.

On the front side of the semiconductor layer SB1, the gate electrode TGgr is arranged on the impurity diffusion layer H between the impurity diffusion layers H8 and H10, and the gate electrode TGgb is arranged on the impurity diffusion layer H1 between the impurity diffusion layers H9 and H10. The light shielding film SH is buried in the interlayer insulating film E on the gate electrodes TGgr, TGgb, and the impurity diffusion layer H10. The green photoelectric conversion film G is formed on the interlayer insulating film E to cover the entire surface of the semiconductor layer SB1. On the underside of the green photoelectric conversion film G, transparent electrodes D1, D2 are provided for the green photoelectric conversion films Gr, Gb, respectively, and a transparent electrode D3 is formed on the top surface of the green photoelectric conversion film G. The microlens Z1 is arranged for each pixel PC on the transparent electrode D3. A contact plug P1 is formed on the impurity diffusion layer H8 and connected to the transparent electrode D1. A contact plug P2 is formed on the impurity diffusion layer H9 and connected to the transparent electrode D2.

The light is collected by the microlens Z1 and reaches the green photoelectric conversion films Gr, Gb where the green light is absorbed in the green photoelectric conversion films Gr, Gb. Accordingly, the green photoelectric conversion films Gr, Gb photoelectrically convert the green light to generate electric charges which are then stored in the storage diodes SD-Gr, SD-Gb. A read-out voltage is applied to the gate electrode TGgr, and the electric charges stored in the storage diode SD-Gr are read and transferred into the floating diffusion FD. A read-out voltage is applied to the gate electrode TGgb, and the electric charges stored in the photo diode SD-Gb are read and transferred into the floating diffusion FD.

Since the green photoelectric conversion films Gr, Gb and the photo diodes PD-R, PD-B have overlapped each other in a depth direction, the color mixture can be reduced, and the sensitivity to green can be improved twice as high as that of the Bayer arrangement having a single layer structure.

Figure 8:
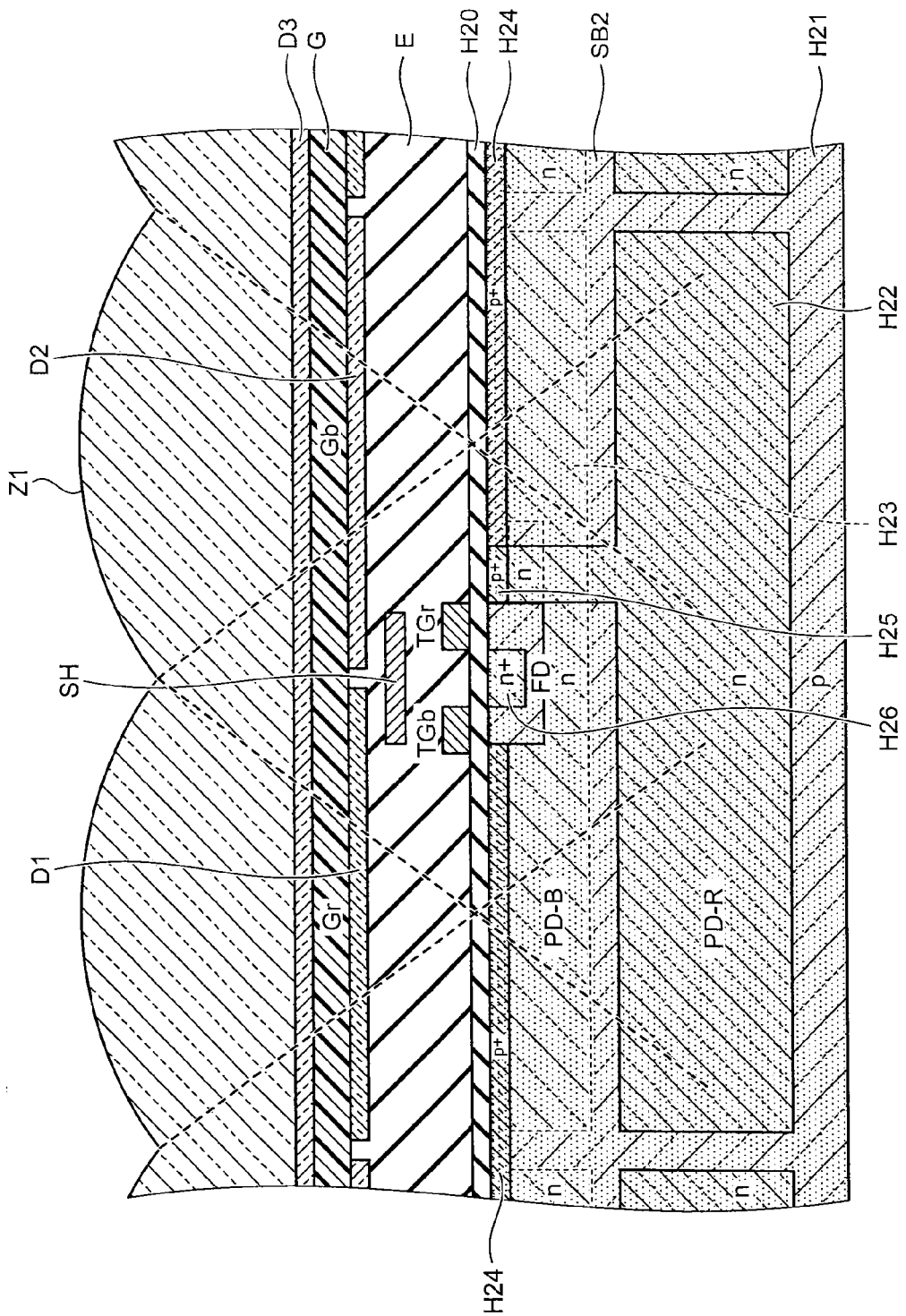
FIG. 8 is a cross-sectional view schematically illustrating an alternative structure of the solid-state imaging device of FIG. 6.

FIG. 8 is a cross-sectional view schematically illustrating an alternative structure of the solid-state imaging device of FIG. 6. FIG. 8 exemplarily illustrates a front side irradiation type CMOS sensor.

In FIG. 8, an impurity diffusion layer H21 is formed in a semiconductor layer SB2, and a gate insulating film H20 is formed on the front side of the impurity diffusion layer H21. At the photo diode PD-B, an impurity diffusion layer H23 is formed in the semiconductor layer SB2, and an impurity diffusion layer H24 is formed on the front side of the impurity diffusion layer H23. At the photo diode PD-R, an impurity diffusion layer H22 is formed in the semiconductor layer SB2. The impurity diffusion layer H22 is arranged below the impurity diffusion layer H23, and the center part of the impurity diffusion layer H22 is extracted to the front side of the semiconductor layer SB2. An impurity diffusion layer H25 is formed on the extracted part of the impurity diffusion layer H22. On the front side of the semiconductor layer SB2, an impurity diffusion layer H26 is formed between the extracted part of the impurity diffusion layer H22 and the center part of the impurity diffusion layer H23 as the floating diffusion FD. The impurity diffusion layer H21 may be set as a p-type layer. The impurity diffusion layers H22, H23 may be set as n-type layers. The impurity diffusion layers H24, H25 may be set as $p^+$-type layers. The impurity diffusion layer H26 may be set as an $n^+$-type layer.

On the front side of the semiconductor layer SB2, the gate electrode TGb is arranged on the impurity diffusion layer H21 between the impurity diffusion layers H24 and H26, and the gate electrode TGr is arranged on the impurity diffusion layer H21 between the impurity diffusion layers H25 and H26. The light shielding film SH is buried in the interlayer insulating film E on the gate electrodes TGb, TGr and the impurity diffusion layer H26. The green photoelectric conversion film G is formed on the interlayer insulating film E to cover the entire surface of the semiconductor layer SB2. On the underside of the green photoelectric conversion film G, transparent electrodes D1, D2 are provided for the green photoelectric conversion films Gr, Gb, respectively, and a transparent electrode D3 is formed on the top surface of the green photoelectric conversion film G. The microlens Z1 is arranged for each pixel PC on the transparent electrode D3.

Figure 9:
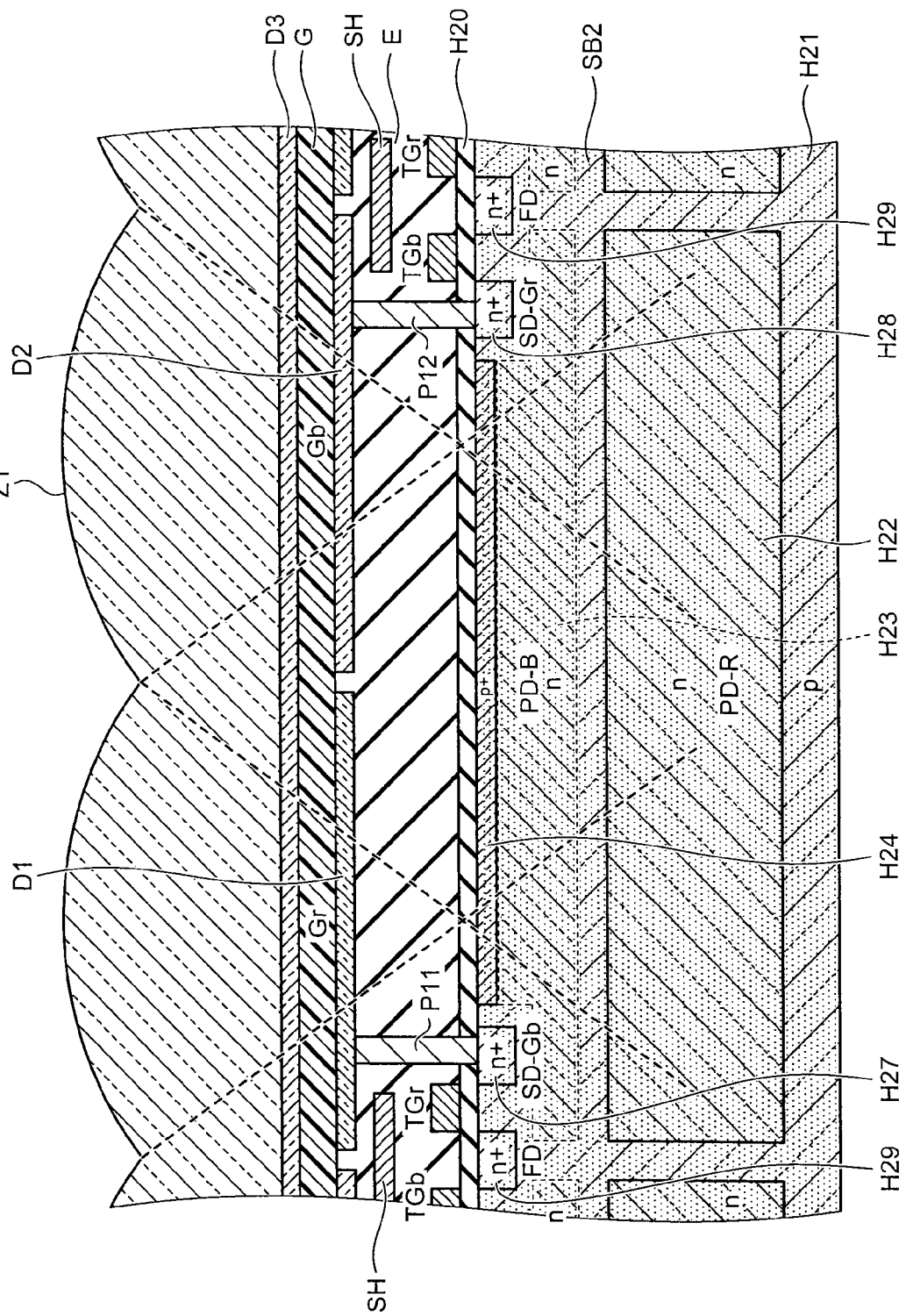
FIG. 9 is a cross-sectional view schematically illustrating an alternative structure of the solid-state imaging device of FIG. 7.

FIG. 9 is a cross-sectional view schematically illustrating an alternative structure of the solid-state imaging device of FIG. 7. FIG. 9 exemplarily illustrates a front side irradiation type CMOS sensor.

In FIG. 9, the impurity diffusion layer H21 is formed in the semiconductor layer SB2, and the gate insulating film H20 is formed on the front side of the impurity diffusion layer H21. At the photo diode PD-B, an impurity diffusion layer H23 is formed in the semiconductor layer SB2, and an impurity diffusion layer H24 is formed on the front side of the impurity diffusion layer H23. At the photo diode PD-R, an impurity diffusion layer H22 is formed in the semiconductor layer SB2. On the front side of the semiconductor layer SB2, impurity diffusion layers H27, H28 are formed on both ends of the photo diode PD-B as the storage diode SD-Gb, SD-Gr. On the front side of the semiconductor layer SB2, an impurity diffusion layer H29 is formed between the impurity diffusion layers H27 and H28 of adjacent pixels as floating diffusion FD. The impurity diffusion layers H27, H28, H29 may be set as $n^+$-type layers.

On the front side of the semiconductor layer SB2, the gate electrode TGgr is arranged on the impurity diffusion layer H21 between the impurity diffusion layers H27 and H29, and the gate electrode TGgb is arranged on the impurity diffusion layer H21 between the impurity diffusion layers H28 and H29. The light shielding film SH is buried in the interlayer insulating film E on the gate electrodes TGgr, TGgb, and the impurity diffusion layer H29. The green photoelectric conversion film G is formed on the interlayer insulating film E to cover the entire surface of the semiconductor layer SB2. On the underside of the green photoelectric conversion film G, transparent electrodes D1, D2 are provided for the green photoelectric conversion films Gr, Gb, respectively, and a transparent electrode D3 is formed on the top surface of the green photoelectric conversion film G. The microlens Z1 is arranged for each pixel PC on the transparent electrode D3. A contact plug P11 is formed on the impurity diffusion layer H27 and connected to the transparent electrode D1. A contact plug P12 is formed on the impurity diffusion layer H28 and connected to the transparent electrode D2.

Figure 10:
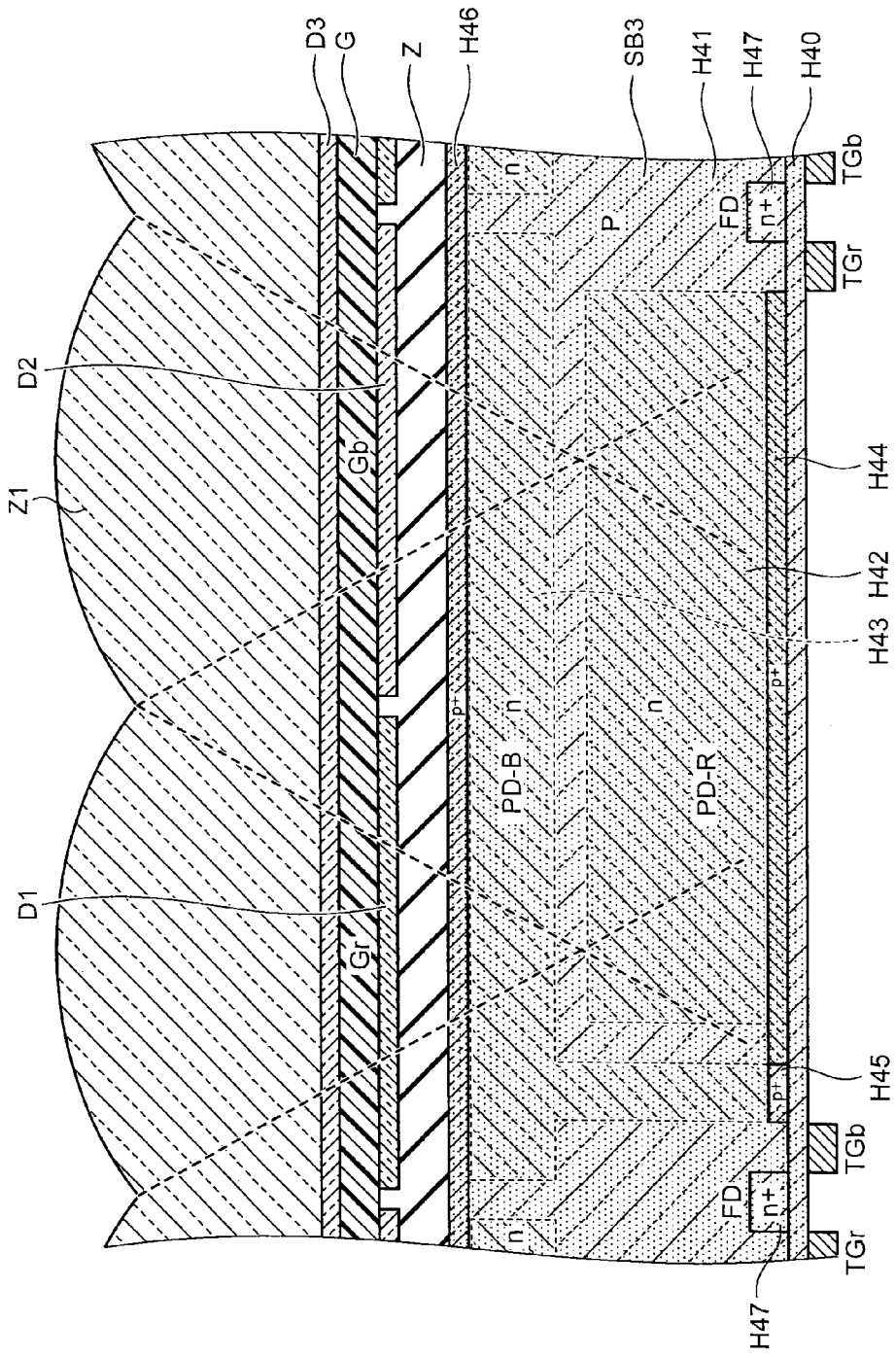
FIG. 10 is a cross-sectional view schematically illustrating an alternative structure of the solid-state imaging device of FIG. 6.

FIG. 10 is a cross-sectional view schematically illustrating an alternative structure of the solid-state imaging device of FIG. 6. FIG. 10 exemplarily illustrates a back side irradiation type CMOS sensor.

In FIG. 10, an impurity diffusion layer H41 is formed in a semiconductor layer SB3, and a gate insulating film H40 is formed on the surface side of an impurity diffusion layer H41. At the photo diode PD-B, an impurity diffusion layer H43 is formed in the semiconductor layer SB3, and an impurity diffusion layer H46 is formed on the back side of the impurity diffusion layer H43. At the photo diode PD-R, an impurity diffusion layer H42 is formed in the semiconductor layer SB3, and an impurity diffusion layer H44 is formed on the surface side of the impurity diffusion layer H42. The impurity diffusion layer H43 is arranged below the impurity diffusion layer H42, and extracted to the front side of the semiconductor layer SB3 by passing through the side of the impurity diffusion layer H42. The impurity diffusion layer H45 is formed on the extracted part of the impurity diffusion layer H43. On the front side of the semiconductor layer SB3, an impurity diffusion layer H47 is formed, as the floating diffusion FD, between the extracted part of the impurity diffusion layer H43 and the impurity diffusion layer H42 between the adjacent pixels. The impurity diffusion layer H41 may be set as a p-type layer. The impurity diffusion layers H42, H43 may be set as n-type layers. The impurity diffusion layers H44, H45, H46 may be set as p$^+$-type layers. The impurity diffusion layer H47 may be set as an n$^+$-type layer.

On the front side of the semiconductor layer SB3, the gate electrode TGr is arranged on the impurity diffusion layer H41 formed between the impurity diffusion layers H44 and H47, and the gate electrode TGb is arranged on the impurity diffusion layer H41 formed between the impurity diffusion layers H45 and H47. An interlayer insulating film Z is formed on the back side of the semiconductor layer SB3, and a green photoelectric conversion film G is formed on the interlayer insulating film Z to cover the entire surface of the semiconductor layer SB3. The transparent electrodes D1, D2 are formed on the top surface of the green photoelectric conversion film G for the green photoelectric conversion films Gr, Gb, respectively, and the transparent electrode D3 is formed on the underside of the green photoelectric conversion film G. The microlens Z1 is arranged for each pixel PC on the transparent electrode D3.

Figure 11:
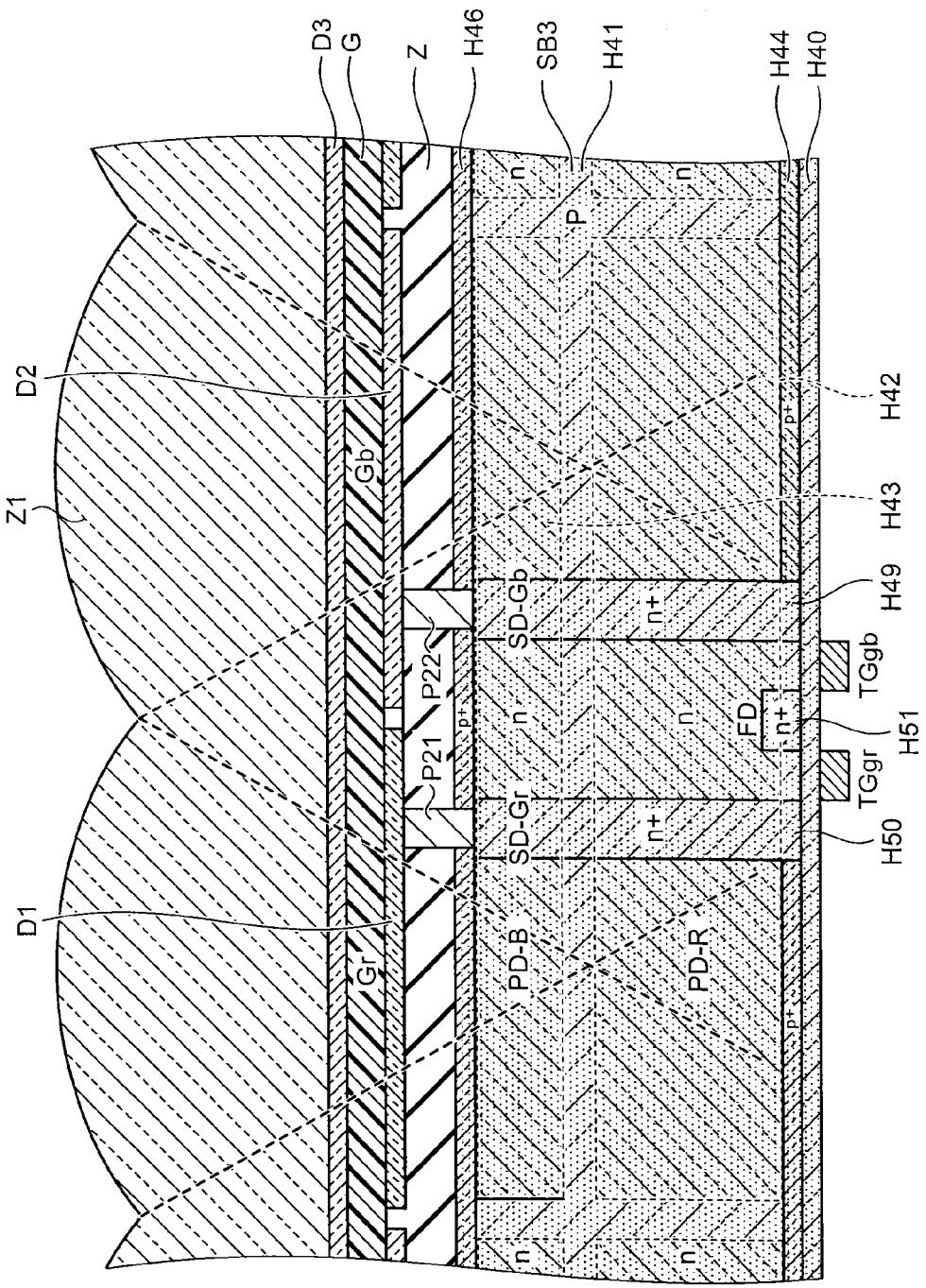
FIG. 11 is a cross-sectional view schematically illustrating an alternative structure of the solid-state imaging device of FIG. 8.

FIG. 11 is a cross-sectional view schematically illustrating an alternative structure of the solid-state imaging device of FIG. 8. FIG. 11 exemplarily illustrates a back side irradiation type CMOS sensor.

In FIG. 11, the impurity diffusion layer H41 is formed in the semiconductor layer SB3, and the gate insulating film H40 is formed on the surface side of the impurity diffusion layer H41. At the photo diode PD-B, the impurity diffusion layer H43 is formed in the semiconductor layer SB3. At the photo diode PD-R, an impurity diffusion layer H42 is formed in the semiconductor layer SB3, and an impurity diffusion layer H44 is formed on the surface side of the impurity diffusion layer H42. Impurity diffusion layers H49, H50 are formed from the back side to the front side of the semiconductor layer SB3 as the storage diodes SD-Gb, SD-Gr. On the front side of the semiconductor layer SB3, an impurity diffusion layer H51 is formed between the impurity diffusion layers H49 and H50 as the floating diffusion FD. The impurity diffusion layers H49, H50, H51 may be set as n$^+$-type layers.

On the front side of the semiconductor layer SB3, the gate electrode TGgr is arranged on the impurity diffusion layer H41 between the impurity diffusion layers H50 and H51. The gate electrode TGgb is arranged on the impurity diffusion layer H41 between the impurity diffusion layers H49 and H51. The interlayer insulating film Z is formed on the back side of the semiconductor layer SB3, and the green photoelectric conversion film G is formed on the interlayer insulating film Z to cover the entire surface of the semiconductor layer SB3. The transparent electrodes D1, D2 are formed on the top surface of the green photoelectric conversion film G for the green photoelectric conversion films Gr, Gb, respectively, and the transparent electrode D3 is formed on the underside of the green photoelectric conversion film G. The microlens Z1 is arranged for each pixel PC on the transparent electrode D3. A contact plug P21 is formed on the back side of the impurity diffusion layer H50 and connected to the transparent electrode D1. A contact plug P22 is formed on the back side of the impurity diffusion layer H49 and connected to the transparent electrode D2.

In the example of FIG. 11, the impurity diffusion layers H49, H50 are formed from the back side to the front side of the semiconductor layer SB3 to form the storage diodes SD-Gb, SD-Gr. Alternatively, it is also possible to bury an electrode on the back side of the semiconductor layer SB3 to connect with the impurity diffusion layer formed on the surface of the semiconductor layer SB3.

(Second Embodiment)

Figure 12:
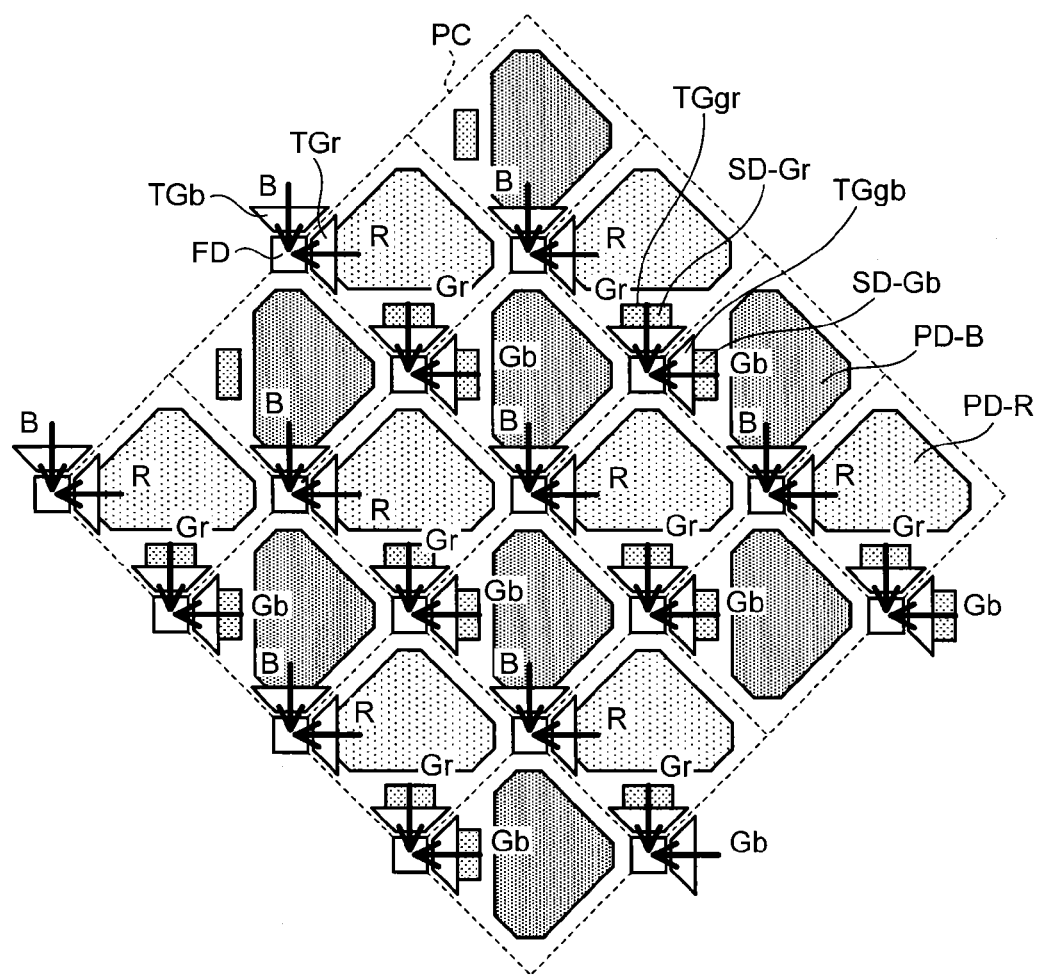
FIG. 12 is a plan view illustrating an exemplary layout of photo diodes, floating diffusion, and gate electrodes of a solid-state imaging device according to a second embodiment.

FIG. 12 is a plan view illustrating an exemplary layout of photo diodes, floating diffusion, and gate electrodes of a solid-state imaging device according to a second embodiment.

The photo diodes PD-R, PD-B illustrated in FIG. 5 have overlapped each other in a depth direction to spread over two pixels.

In contrast, in FIG. 12, the photo diodes PD-R, PD-B are formed separately for each pixel. The photo diodes PD-R, PD-B may be arranged alternately for each pixel.

(Third Embodiment)

Figure 13:
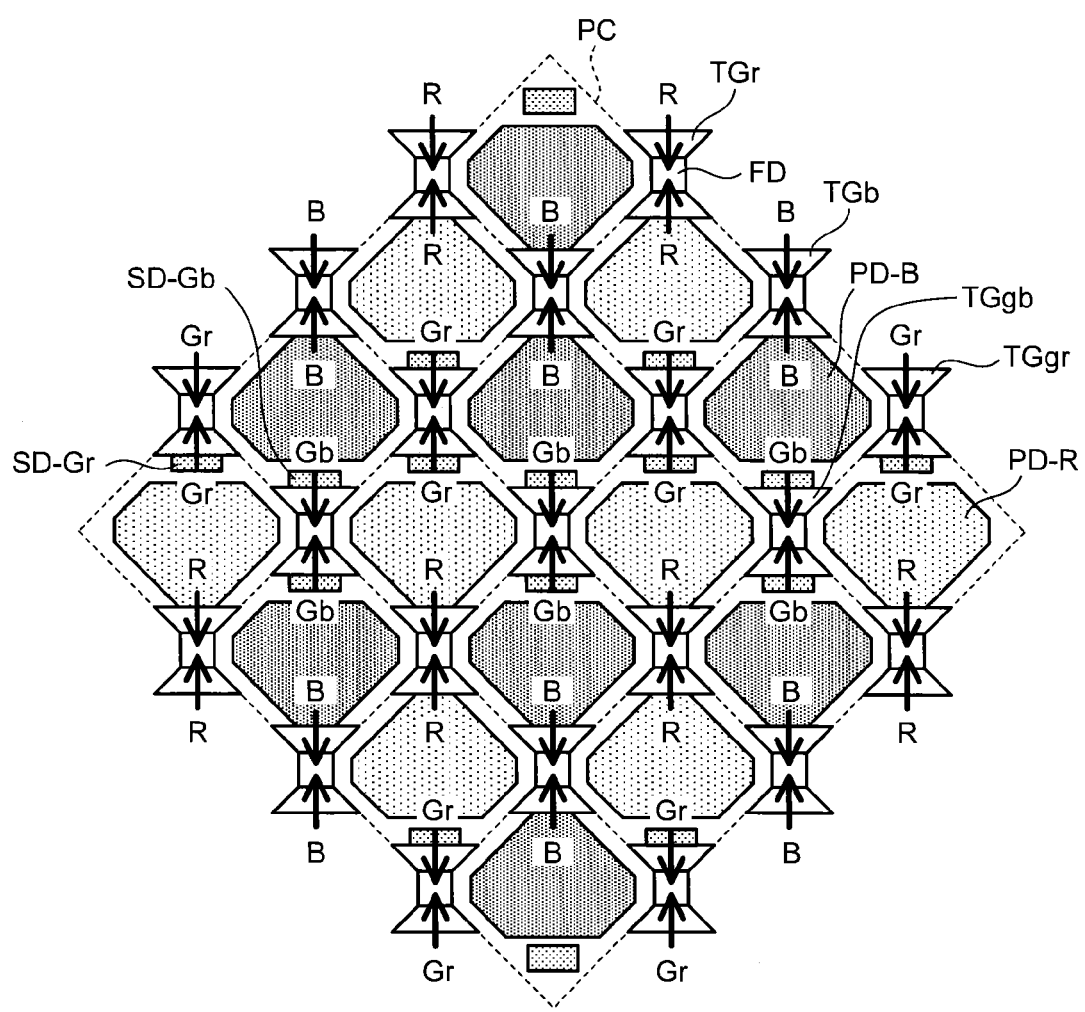
FIG. 13 is a plan view illustrating an exemplary layout of photo diodes, floating diffusion, and gate electrodes of a solid-state imaging device according to a third embodiment.

FIG. 13 is a plan view illustrating an exemplary layout of photo diodes, floating diffusion, and gate electrodes of a solid-state imaging device according to a third embodiment.

The floating diffusion FD illustrated in FIG. 12 has been shared by two pixels arranged adjacent to each other diagonally.

In contrast, in FIG. 13, the floating diffusion FD is shared by two pixels arranged adjacent to each other in the column direction CD.

(Fourth Embodiment)

Figure 14:
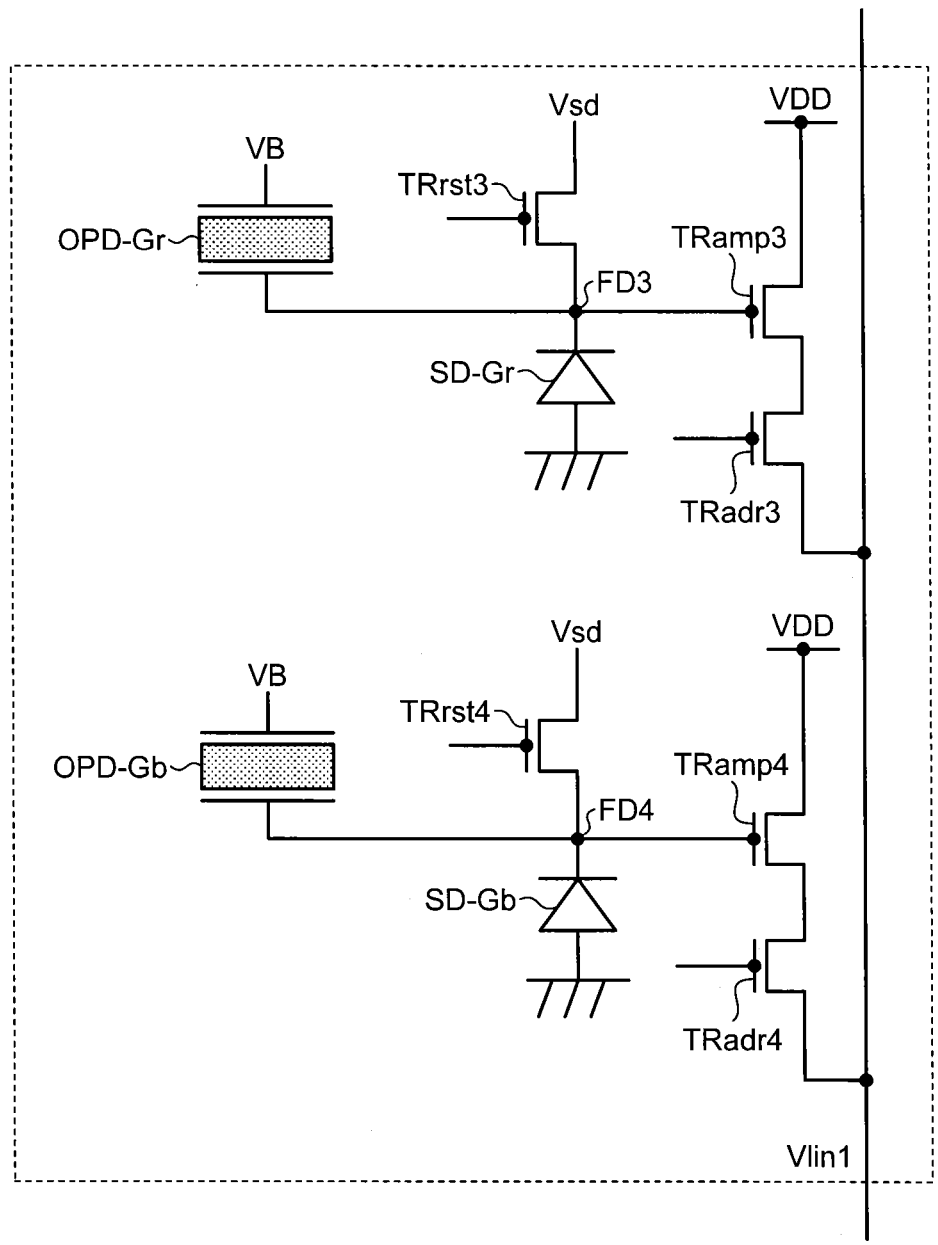
FIG. 14 is a block diagram schematically illustrating a two-pixels-for-a-cell structure of a solid-state imaging device according to a fourth embodiment.

FIG. 14 is a block diagram schematically illustrating a two-pixels-for-a-cell structure of a solid-state imaging device according to a fourth embodiment.

In FIG. 14, a cell includes photoelectric conversion devices OPD-Gr, OPD-Gb, storage diodes SD-Gr, SD-Gb, row selecting transistors TRadr3, TRadr4, amplifying transistors TRamp3, TRamp4, and reset transistors TRrst3, TRrst4. A floating diffusion FD3 is formed as a detection node at a joint of the amplifying transistor TRamp3, the reset transistor TRrst3, and the storage diode SD-Gr. A floating diffusion FD4 is formed as a detection node at a joint of the amplifying transistor TRamp4, the reset transistor TRrst4, and the storage diode SD-Gb.

The drains of the reset transistors TRrst3, TRrst4 are connected to a power supply potential Vsd. The drains of the amplifying transistors TRamp3, TRamp4 are connected to a power supply potential VDD. The amplifying transistor TRamp3 has its gate connected to the source of the reset transistor TRrst3, the storage diode SD-Gr, and the photoelectric conversion device OPD-Gr. The amplifying transistor TRamp4 has its gate connected to the source of the reset transistor TRrst4, the storage diode SD-Gb, and the photoelectric conversion device OPD-Gb. The row selecting transistor TRadr3 has its drain connected to the source of the amplifying transistor TRamp3, and the row selecting transistor TRadr4 has its drain connected to the source of the amplifying transistor TRamp4. The sources of the row selecting transistors TRadr3, TRadr4 are connected to the vertical signal line Vlin1.

Figure 15:
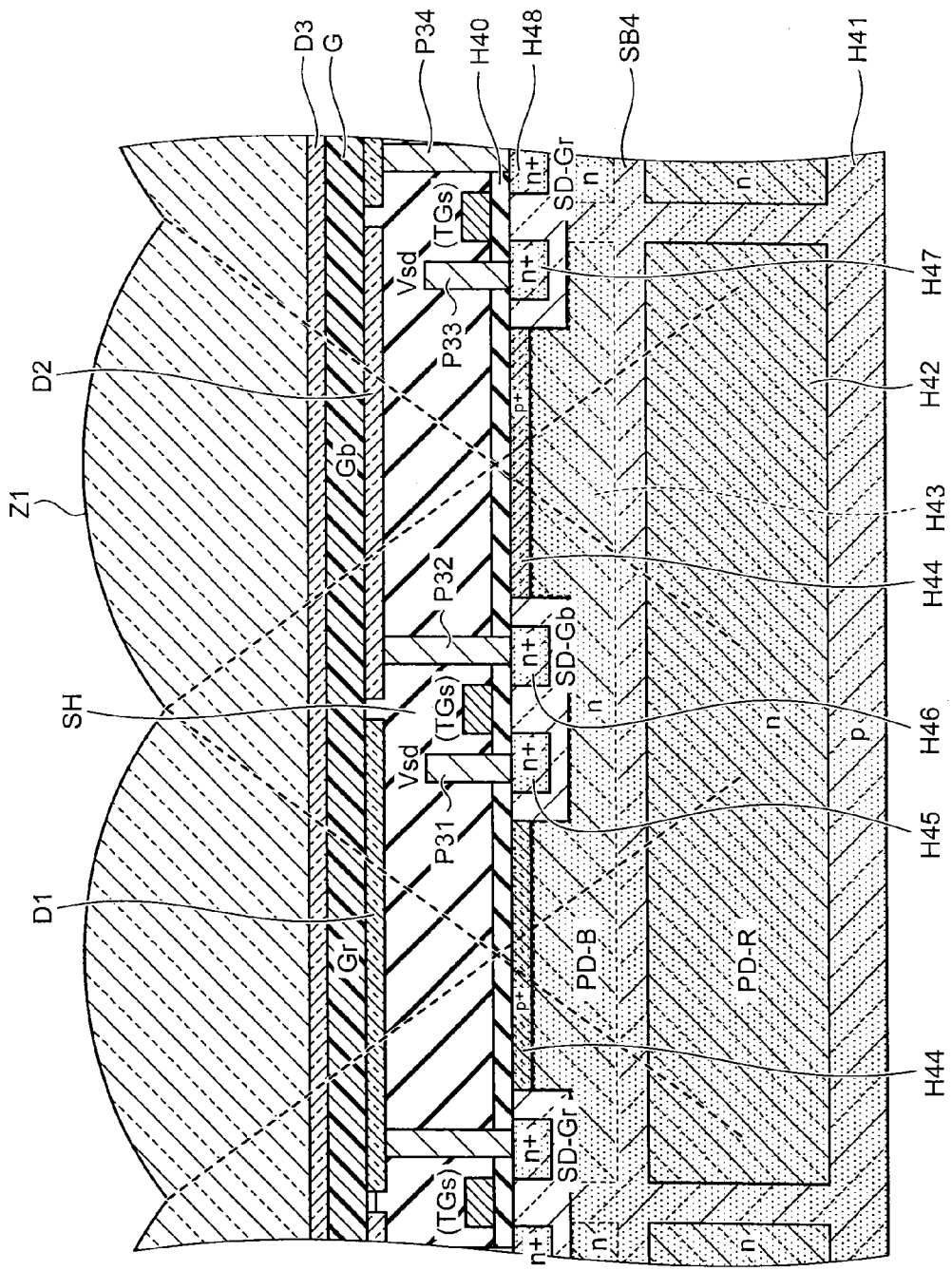
FIG. 15 is a block diagram schematically illustrating a solid-state imaging device according to the fourth embodiment.

FIG. 15 is a block diagram schematically illustrating the solid-state imaging device according to the fourth embodiment. FIG. 15 exemplarily illustrates a front side irradiation type CMOS sensor.

In FIG. 15, the impurity diffusion layer H41 is formed in a semiconductor layer SB4, and the gate insulating film H40 is formed on the front side of an impurity diffusion layer H41. At the photo diode PD-B, the impurity diffusion layer H43 is formed in the semiconductor layer SB4, and the impurity diffusion layer H44 is formed on the front side of the impurity diffusion layer H43. At the photo diode PD-R, the impurity diffusion layer H42 is formed in the semiconductor layer SB4. On the font side of the semiconductor layer SB4, an impurity diffusion layers H48 is formed at the end of the photo diode PD-B as the storage diode SD-Gr. An impurity diffusion layer H46 is formed in the center of the photo diode PD-B as the storage diode SD-Gb. On the front side of the semiconductor layer SB4, the impurity diffusion layer H45 is formed adjacent to the impurity diffusion layer H46, and the impurity diffusion layer H47 is formed adjacent to the impurity diffusion layer H48. The impurity diffusion layer H41 may be set as a p-type layer. The impurity diffusion layers H42, H43 may be set as n-type layers. The impurity diffusion layer H44 may be set as a $p^+$-type layer. The impurity diffusion layers H45, H46, H47, H48 may be set as $n^+$-type layers.

On the front side of the semiconductor layer SB4, a gate electrode TGs is arranged on the impurity diffusion layer H41 between the impurity diffusion layers H45 and H46 and between the impurity diffusion layers H47 and H48, respectively. The green photoelectric conversion film G is formed on the gate electrode TGs to cover the entire surface of the semiconductor layer SB4. On the underside of the green photoelectric conversion film G, transparent electrodes D1, D2 are provided for the green photoelectric conversion films Gr, Gb, respectively, and a transparent electrode D3 is formed on the top surface of the green photoelectric conversion film G. The microlens Z1 is arranged for each pixel PC on the transparent electrode D3. A contact plug P34 is formed on the impurity diffusion layer H47 and connected to the transparent electrode D1. A contact plug P32 is formed on the impurity diffusion layer H46 and connected to the transparent electrode D2. Contact plugs P31, P33 are formed on the impurity diffusion layers H45, H47, respectively, and a power supply potential Vsd is applied to the contact plugs P31, P33.

(Fifth Embodiment)

Figure 16A:
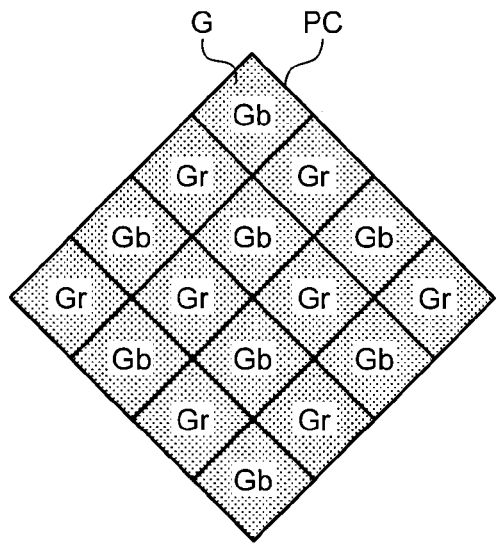
FIG. 16A is a plan view illustrating an exemplary layout of a green photoelectric conversion film of a solid-state imaging device according to a fifth embodiment.
Figure 16B:
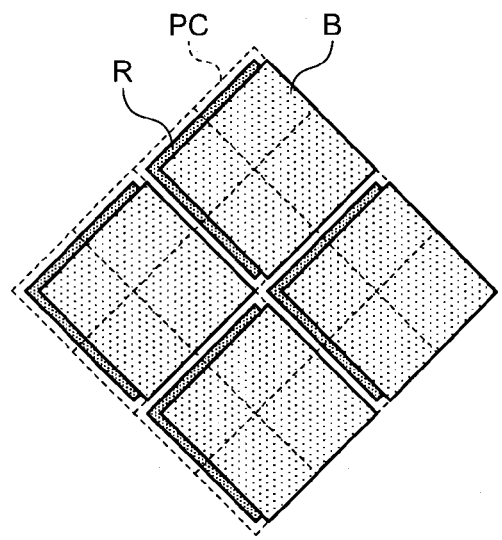
FIG. 16B is a plan view illustrating an exemplary layout of a red photoelectric conversion layer and a blue photoelectric conversion layer of the solid-state imaging device according to the fifth embodiment.
Figure 16C:
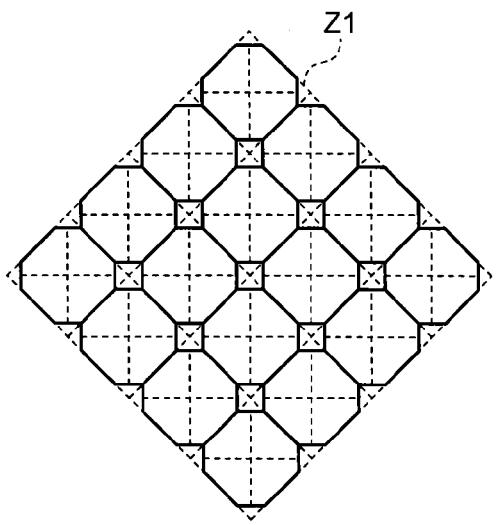
FIG. 16C is a plan view illustrating an exemplary layout of a microlens of the solid-state imaging device according to the fifth embodiment.

FIG. 16A is a plan view illustrating an exemplary layout of a green photoelectric conversion film of a solid-state imaging device according to a fifth embodiment. FIG. 16B is a plan view illustrating an exemplary layout of a red photoelectric conversion layer and a blue photoelectric conversion layer of the solid-state imaging device according to the fifth embodiment. FIG. 16C is a plan view illustrating an exemplary layout of a microlens of the solid-state imaging device according to the fifth embodiment.

FIG. 16A, the green photoelectric conversion films Gr, Gb are formed as the green photoelectric conversion film G for each pixel PC. At this time, the green photoelectric conversion film G may cover the entire pixels PC.

In FIG. 16B, the red photoelectric conversion layer R and the blue photoelectric conversion layer B are arranged to be overlapped by the green photoelectric conversion film G in a depth direction for the pixel PC. At this time, the red photoelectric conversion layer R and the blue photoelectric conversion layer B can be provided to spread over a place corresponding to four pixels arranged in a square.

In FIG. 16C, the microlens Z1 may be provided for each pixel PC. The microlens Z1 may be arranged on the green photoelectric conversion film G. The microlens Z1 may not be provided.

Since the red photoelectric conversion layer R and the blue photoelectric conversion layer B have overlapped each other for four pixels, the red photoelectric conversion layer R and the blue photoelectric conversion layer B can share a read-out circuit among four pixels, and circuit size can be decreased. The signal quantity in the red photoelectric conversion layer R and the blue photoelectric conversion layer B can also be increased, and the SNR can be increased. Specifically, the pixel size of the red photoelectric conversion layer R and the blue photoelectric conversion layer B can be twice as large as that of the structure of FIG. 2B to double the sensitivity, and the color noise can be reduced.

In this structure, one pixel each of the blue and red pixels is provided for four green pixels, compared to the single layered Bayer arrangement. Human eyes have resolution more sensitive to green pixels than blue and red pixels. In a CMOS sensor having more than 8M pixels, in particular, the decrease of color resolution of blue and red pixels is not significantly noticed, such that the number of the blue and red pixels may be less than the number of the green pixels. Correlation coefficient (AveSr/AveSg, AveSb/AveSg) is generated from an average pixel signal AveSg of a plurality of green pixels, an average pixel signal AveSr of a plurality of red pixels, and an average pixel signal AveSb of a plurality of blue pixels. Then a single green pixel signal Sg is multiplied by the correlation coefficient to obtain the color resolution that is substantially equal to that of the green pixel. Accordingly, an occurrence of false colors caused by a decrease of the number of color pixels can be significantly reduced.

Figure 17:
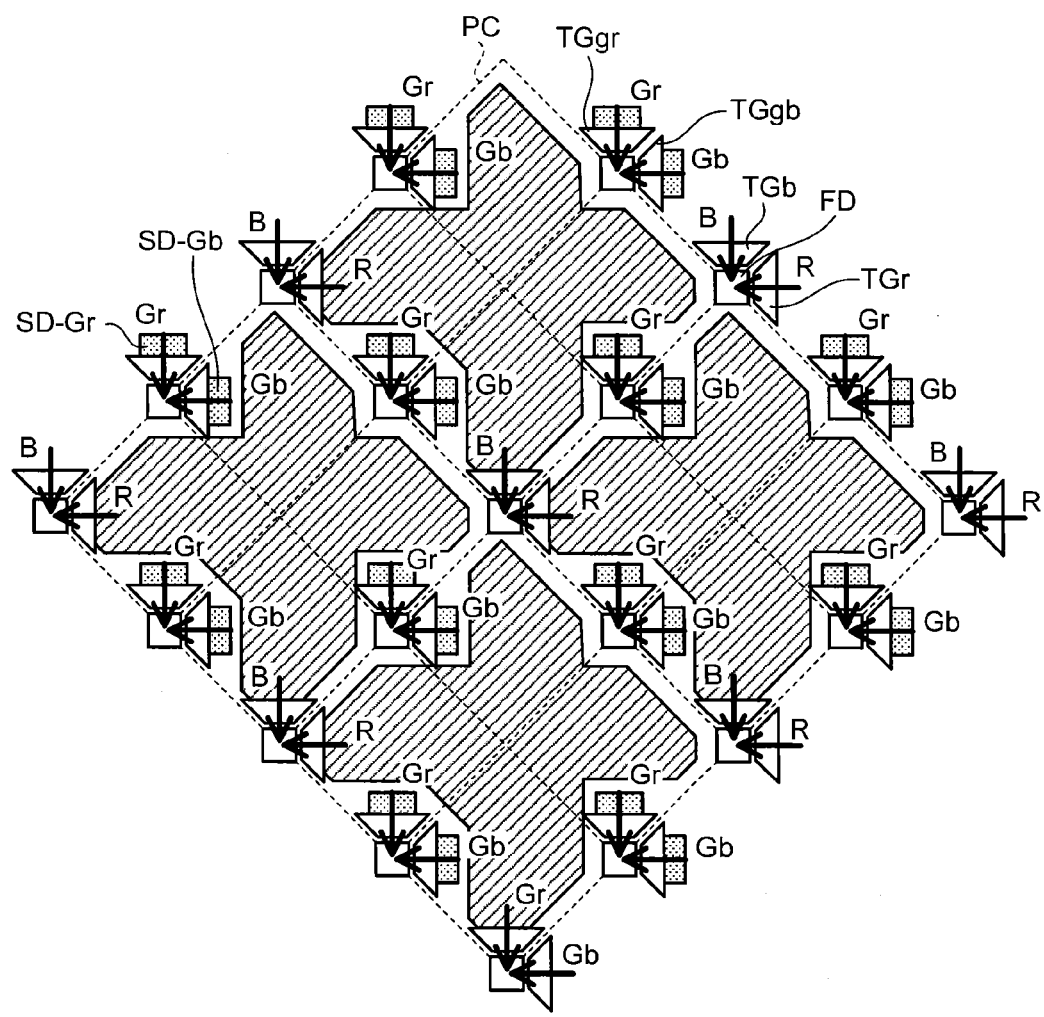
FIG. 17 is a plan view illustrating an exemplary layout of photo diodes, floating diffusion, and gate electrodes of a solid-state imaging device according to the fifth embodiment.

FIG. 17 is a plan view illustrating an exemplary layout of photo diodes, floating diffusion, and gate electrodes of a solid-state imaging device according to the fifth embodiment.

The photo diodes PD-R, PD-B illustrated in FIG. 5 have overlapped each other in a depth direction to spread over two pixels.

In contrast, in FIG. 17, the photo diodes PD-R, PD-B overlap each other in a depth direction for four pixels. The floating diffusion FD is shared by the photo diodes PD-R, PD-B of four pixels. The gate electrodes TGgr, TGgb may be arranged in directions along four sides of the photo diodes PD-R, PD-B, and the gate electrodes TGr, TGb may be arranged at four diagonal points of the photo diodes PD-R, PD-B.

(Sixth Embodiment)

FIG. 18 is a block diagram schematically illustrating a solid-state imaging device according to a sixth embodiment.

In FIG. 18, a solid-state imaging device includes a lens 41, a CMOS sensor 42, a white balance unit 43, an interpolating processing unit 44, a contour enhancement unit 45, a γ correction unit 46, and a linear matrix unit 47. The CMOS sensor 42 may be formed by using the structure illustrated in FIG. 1. The pixel array 1 of FIG. 1 may be formed by using the structure illustrated in FIG. 5 or FIG. 17. The pixel array 1 of FIG. 1 may be formed by using the structure illustrated in FIG. 12 or FIG. 13.

Light enters the CMOS sensor 42 through the lens 41, and the CMOS sensor 42 outputs pixel signals Sr, Sb, Sg, whose sensitivity have been adjusted by storage time control. The white balance unit 43 performs gain control of the pixel signals Sr, Sb, Sg so as to make a white object be white. The interpolating processing unit 44 performs interpolating processing to make the pixel signals Sr, Sb, Sg, which correspond to a diagonal arrangement at an angle of 45 degrees of the CMOS sensor 42, correspond to a square arrangement. Accordingly, a pixel signal Sgh is generated. The pixel signal Sgh may be generated according to the pixel signals Sg of the pixels located around a specific pixel. The number of green pixels can be doubled by the interpolating processing, and the resolution is also doubled. The red pixels and the blue pixels are then generated corresponding to the locations of the green pixels. Next, the contour enhancement unit 45 extracts a resolution signal (contour signal) from the green pixels, and each signal level of the contour signals is added to the pixel signals Sr, Sb, Sg, Sgh. The contour enhancement processing contributes to improvement of high-resolution feeling. After the γ correction unit 46 performs γ correction for the pixel signals Sr, Sb, Sg, Sgh, the linear matrix unit 47 performs linear matrix processing to adjust color reproducibility. The linear matrix processing may be performed by using an equation below:

$$\begin{pmatrix} Rout \\ Gout \\ Bout \end{pmatrix} = \begin{pmatrix} 1.83 & -0.80 & -0.03 \\ -0.68 & 1.76 & -0.08 \\ -0.33 & -0.80 & 2.13 \end{pmatrix} * \begin{pmatrix} Rin \\ Gin \\ Bin \end{pmatrix}$$

where Rin corresponds to the pixel signal Sr, Bin corresponds to the pixel signal Sb, and Gin corresponds to the pixel signals Sg, Sgh.

After the linear matrix processing is performed, the pixel signals Rout, Bout, and Gout are output as RGB signals. Alternatively, the pixel signals Rout, Bout, and Gout may be output by converting the signals into another format such as YUV signals.

(Seventh Embodiment)

FIG. 19A is a plan view illustrating an exemplary layout of a color filter of a solid-state imaging device according to a seventh embodiment. FIG. 19B is a plan view illustrating an alternative exemplary layout of the color filter of the solid-state imaging device according to the seventh embodiment.

Color filters may be provided for each pixel PC on the green photoelectric conversion film G of FIG. 2A or FIG. 16A. At this time, as illustrated in FIG. 12 or FIG. 13, the photo diodes PD-R, PD-B are provided separately for each pixel. Regarding the color filters, as illustrated in FIG. 19A, a cyan filter Cy and a yellow filter Ye may be alternately arranged diagonally to the right and left. Alternatively, as illustrated in FIG. 19B, a cyan filter Cy and a yellow filter Ye may be alternately arranged diagonally to the right, while both filters are sequentially arranged diagonally to the left. The yellow filter Ye is arranged on the photo diode PD-R, and the cyan filter Cy is arranged on the photo diode PD-B. Providing the color filters on the green photoelectric conversion film G leads to improvement of color separability.

Figure 20:
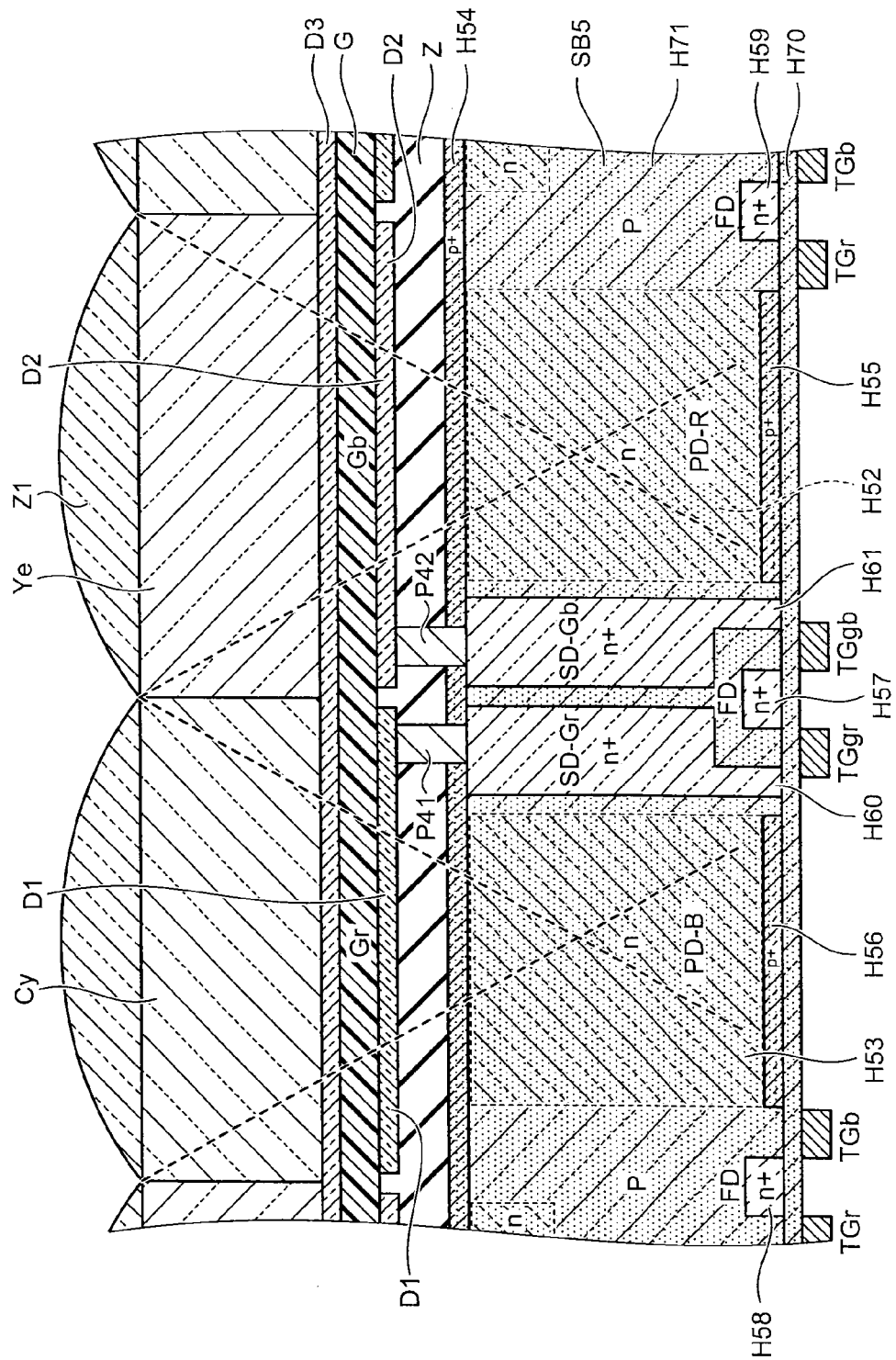
FIG. 20 is a cross-sectional view schematically illustrating an exemplary structure of the solid-state imaging device according to the seventh embodiment.

FIG. 20 is a cross-sectional view schematically illustrating an exemplary structure of the solid-state imaging device according to the seventh embodiment. FIG. 20 exemplarily illustrates a back side irradiation type CMOS sensor.

In FIG. 20, an impurity diffusion layer H71 is formed in a semiconductor layer SB5, and a gate insulating film H70 is formed on the front side of the impurity diffusion layer H71. An impurity diffusion layer H54 is formed on the back side of the impurity diffusion layer H71. At the photo diode PD-B, an impurity diffusion layer H53 is formed in the semiconductor layer SB5, and an impurity diffusion layer H56 is formed on the front side of the impurity diffusion layer H53. At the photo diode PD-R, an impurity diffusion layer H52 is formed in the semiconductor layer SB5, and an impurity diffusion layer H55 is formed on the surface side of the impurity diffusion layer H52. The photo diodes PD-B, PD-R are arranged side by side horizontally. Impurity diffusion layers H60, H61 are formed from the back side to the front side of the semiconductor layer SB5 as storage diodes SD-Gb, SD-Gr. An impurity diffusion layer H57 is formed, as the floating diffusion FD, on the front side of the semiconductor layer SB5 between the impurity diffusion layers H60 and H61. An impurity diffusion layer H58 is formed adjacent to an impurity diffusion layer H56, and an impurity diffusion layer H59 is formed adjacent to the impurity diffusion layer H55. The impurity diffusion layer H71 may be set as a p-type layer. The impurity diffusion layers H52, H53 may be set as n-type layers. The impurity diffusion layers H54 to H56 may be set as $p^+$-type layers. The impurity diffusion layers H57 to H61 may be set as $n^+$-type layers.

On the front side of the semiconductor layer SB5, the gate electrode TGgr is arranged on the impurity diffusion layer H71 between the impurity diffusion layers H57 and H60, the gate electrode TGgb is arranged on the impurity diffusion layer H71 between the impurity diffusion layers H57 and H61, the gate electrode TGr is arranged on the impurity diffusion layer H71 between the impurity diffusion layers H55 and H59, and the gate electrode TGb is arranged on the impurity diffusion layer H71 between the impurity diffusion layers H56 and H58. The interlayer insulating film Z is formed on the back side of the semiconductor layer SB5, and the green photoelectric conversion film G is formed on the interlayer insulating film Z to cover the entire surface of the semiconductor layer SB5. The transparent electrodes D1, D2 are formed on the top surface of the green photoelectric conversion film G for the green photoelectric conversion films Gr, Gb, respectively, and the transparent electrode D3 is formed on the underside of the green photoelectric conversion film G. On the transparent electrode D3, the cyan filter Cy and the yellow filter Ye are arranged corresponding to the photo diodes PD-B, PD-R, respectively. The microlens Z1 is arranged on the cyan filter Cy and the yellow filter Ye for each pixel PC. A contact plug P41 is formed on the back side of the impurity diffusion layer H60 and connected to the transparent electrode D1. A contact plug P42 is formed on the back side of the impurity diffusion layer H61 and connected to the transparent electrode D2.

Light is collected by the microlens Z1 and enters the cyan filter Cy where blue and green lights are extracted and enter the green photoelectric conversion film Gr. The green light is photoelectrically converted in the green photoelectric conversion film Gr to generate electric charges which are then stored in the storage diode SD-Gr. A read-out voltage is applied to the gate electrode TGgr, and the electric charges stored in the storage diode SD-Gr are read and transferred into the floating diffusion FD.

The blue light passes through the green photoelectric conversion film Gr and enters the photo diode PD-B where the blue light is photoelectrically converted to generate electric charges which are then stored in the photo diode PD-B. A read-out voltage is applied to the gate electrode TGb, and the electric charges stored in the photo diode PD-B are read and transferred into the floating diffusion FD.

The light is collected by the microlens Z1 and enters the yellow filter Ye where red and green lights are extracted and enter the green photoelectric conversion film Gb. The green light is photoelectrically converted in the green photoelectric conversion film Gb to generate electric charges which are then stored in the storage diode SD-Gb. A read-out voltage is applied to the gate electrode TGgb, and the electric charges stored in the storage diode SD-Gb are read and transferred into the floating diffusion FD.

The red light passes through the green photoelectric conversion film Gb and enters the photo diode PD-R where the red light is photoelectrically converted to generate electric charges which are then stored in the photo diode PD-R. A read-out voltage is applied to the gate electrode TGr, and the electric charges stored in the photo diode PD-R is read and transferred into the floating diffusion FD.

(Eighth Embodiment)

Figure 21A:
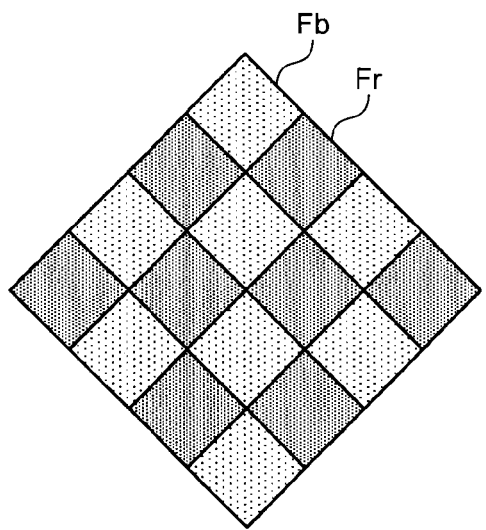
FIG. 21A is a plan view illustrating an exemplary layout of a color filter of a solid-state imaging device according to an eighth embodiment.
Figure 21B:
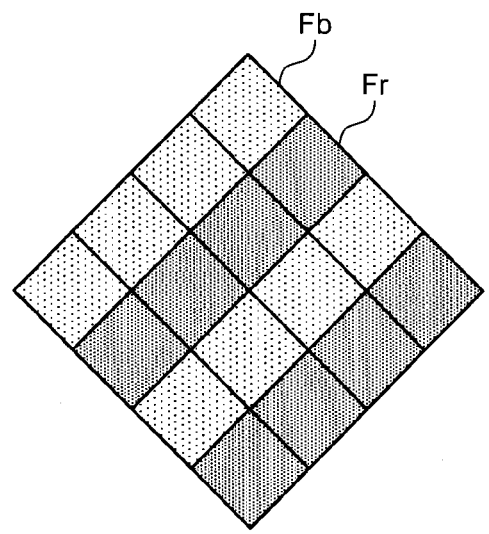
FIG. 21B is a plan view illustrating an alternative exemplary layout of the color filter of the solid-state imaging device according to the eighth embodiment.

FIG. 21A is a plan view illustrating an exemplary layout of a color filter of a solid-state imaging device according to an eighth embodiment. FIG. 21B is a plan view illustrating an alternative exemplary layout of the color filter of the solid-state imaging device according to the eighth embodiment.

A blue filter Fb may be provided on the photo diode PD-B of FIG. 2A or FIG. 16A. A red filter Fr may be provided on the photo diode PD-R of FIG. 2A or FIG. 16A. In contrast, as illustrated in FIG. 21A, the blue filter Fb and the red filter Fr may be alternately arranged diagonally to the right and left. Alternatively, as illustrated in FIG. 21B, the blue filter Fb and the red filter Fr may be alternately arranged diagonally to the right, while both filters are sequentially arranged diagonally to the left. Arranging the blue filter Fb on the photo diode PD-B and the red filter Fr on the photo diode PD-R leads to improvement of color separability of red and blue while preventing a decrease of sensitivity to green.

Figure 22:
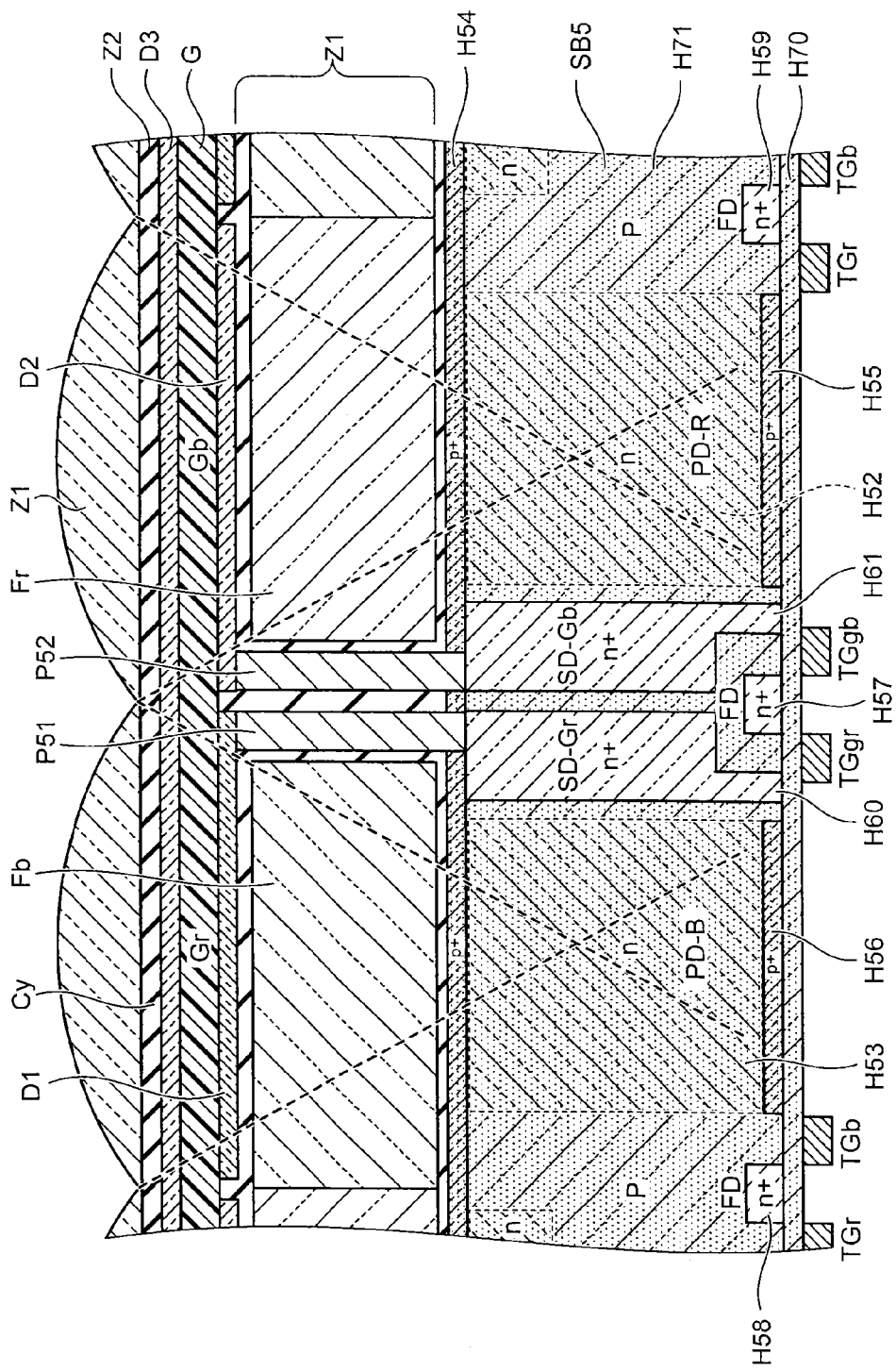
FIG. 22 is a cross-sectional view schematically illustrating the structure of a solid-state imaging device according to the eighth embodiment.

FIG. 22 is a cross-sectional view schematically illustrating the structure of a solid-state imaging device according to the eighth embodiment. FIG. 22 exemplarily illustrates a back side irradiation type CMOS sensor.

In FIG. 22, the blue filter Fb and the red filter Fr are provided instead of the cyan filter Cy and the yellow filter Ye of FIG. 20. The cyan filter Cy and the yellow filter Ye of FIG. 20 have been arranged between the green photoelectric conversion film G and the microlens Z1. In contrast, the blue filter Fb of FIG. 22 is arranged between the green photoelectric conversion film G and the photo diode PD-B, and the red filter Fr of FIG. 22 is arranged between the green photoelectric conversion film G and the photo diode PD-R.

In FIG. 22, contact plugs P51, P52 are provided to penetrate through the blue filter Fb and the red filter Fr, respectively. The impurity diffusion layer H60 is connected to the transparent electrode D1 via the contact plugs P51, and the impurity diffusion layer H61 and the transparent electrode D2 are connected via a contact plug P52. The microlens Z1 is arranged on the transparent electrode D3 through an insulating layer Z2 such as a silicon oxide film.

The light is collected by the microlens Z1 and enters the green photoelectric conversion film Gr where the green light is photoelectrically converted to generate electric charges which are then stored in the storage diodes SD-Gr. A read-out voltage is applied to the gate electrode TGgr, and the electric charges stored in the storage diode SD-Gr are read and transferred into the floating diffusion FD.

The light passes through the green photoelectric conversion film Gr and enters the blue filter Fb where the blue light is extracted and enters the photo diode PD-B. Accordingly, the light is subjected to photoelectric conversion by the photo diode PD-B to generate electric charges which then stored in the photo diode PD-B. A read-out voltage is applied to the gate electrode TGb, and the electric charges stored in the photo diode PD-B are read and transferred into the floating diffusion FD.

The light is collected by the microlens Z1 and enters the green photoelectric conversion film Gb where the green light is photoelectrically converted to generate electric charges which are then stored in the storage diodes SD-Gb. A read-out voltage is applied to the gate electrode TGgb, and the electric charges stored in the storage diode SD-Gb are read and transferred into the floating diffusion FD.

The light passes through the green photoelectric conversion film Gb and enters the red filter Fr where the red light is extracted and enters the photo diode PD-R. Accordingly, the light is photoelectrically converted by the photo diode PD-R to generate electric charges which then stored in the photo diode PD-R. A read-out voltage is applied to the gate electrode TGr, and the electric charges stored in the photo diode PD-R are read and transferred into the floating diffusion FD.

(Ninth Embodiment)

Figure 23:
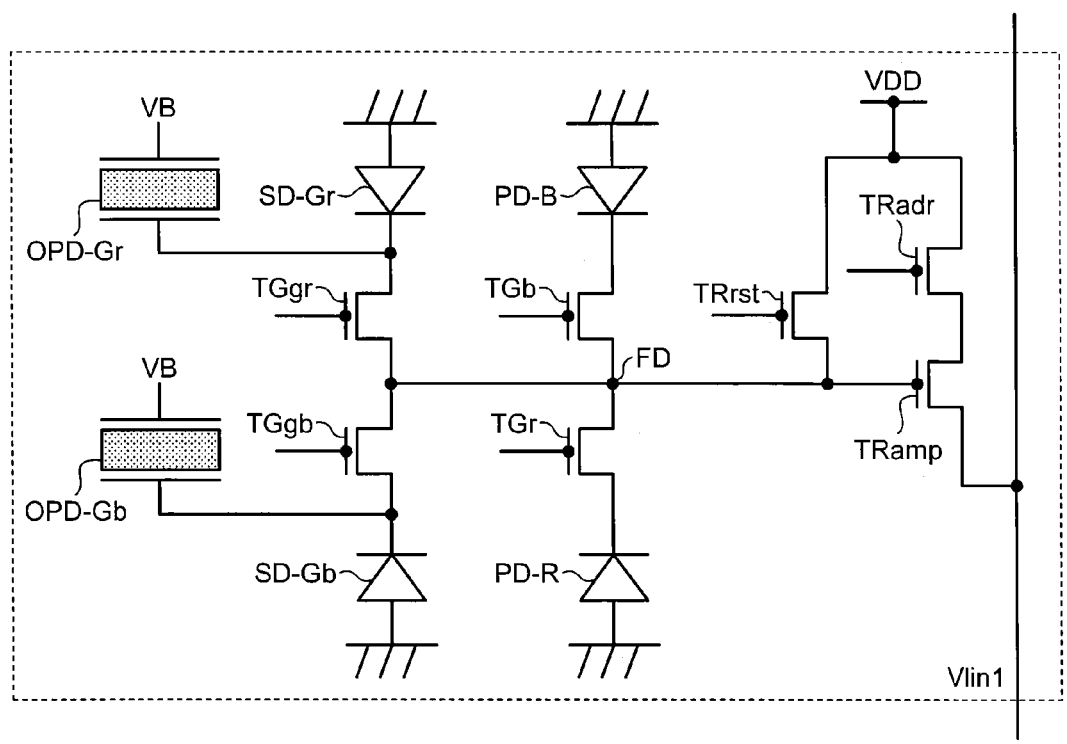
FIG. 23 is a block diagram schematically illustrating a four-pixels-for-a-cell structure of a solid-state imaging device according to a ninth embodiment.

FIG. 23 is a block diagram schematically illustrating a four-pixels-for-a-cell structure of a solid-state imaging device according to a ninth embodiment.

In FIG. 23, a cell includes photoelectric conversion devices OPD-Gr, OPD-Gb, photo diodes PD-B, PD-R, storage diodes SD-Gr, SD-Gb, a row selecting transistor TRadr, an amplifying transistor TRamp, a reset transistor TRrst, and read-out transistors TGb, TGr, TGgr, TGgb. A floating diffusion FD is formed at a joint of the amplifying transistor TRamp, the reset transistor TRrst, and the read-out transistors TGb, TGr, TGgr, TGgb. The floating diffusion FD, the row selecting transistor TRadr, the amplifying transistor TRamp, and the reset transistor TRrst are used as an output circuit and shared by the photoelectric conversion devices OPD-Gr, OPD-Gb and the photo diodes PD-B, PD-R.

The read-out transistor TGr has its source connected to the photo diode PD-R, and the read-out transistor TGb has its source connected to the photo diode PD-B. The read-out transistor TGgr has its source connected to the storage diode SD-Gr and the photoelectric conversion device OPD-Gr, and the read-out transistor TGgb has its source connected to the storage diode SD-Gb and the photoelectric conversion device OPD-Gb. The reset transistor TRrst has its source connected to the drain of the read-out transistors TGb, TGr, TGgr, TGgb, and the drains of the reset transistor TRrst and the row selecting transistor TRadr are connected to a power supply potential VDD. The amplifying transistor TRamp has its source connected to the vertical signal Vlin1, its gate connected to the drains of the read-out transistors TGb, TGr, TGgr, TGgb, and its drain connected to the source of the row selecting transistor TRadr.

Figure 24:
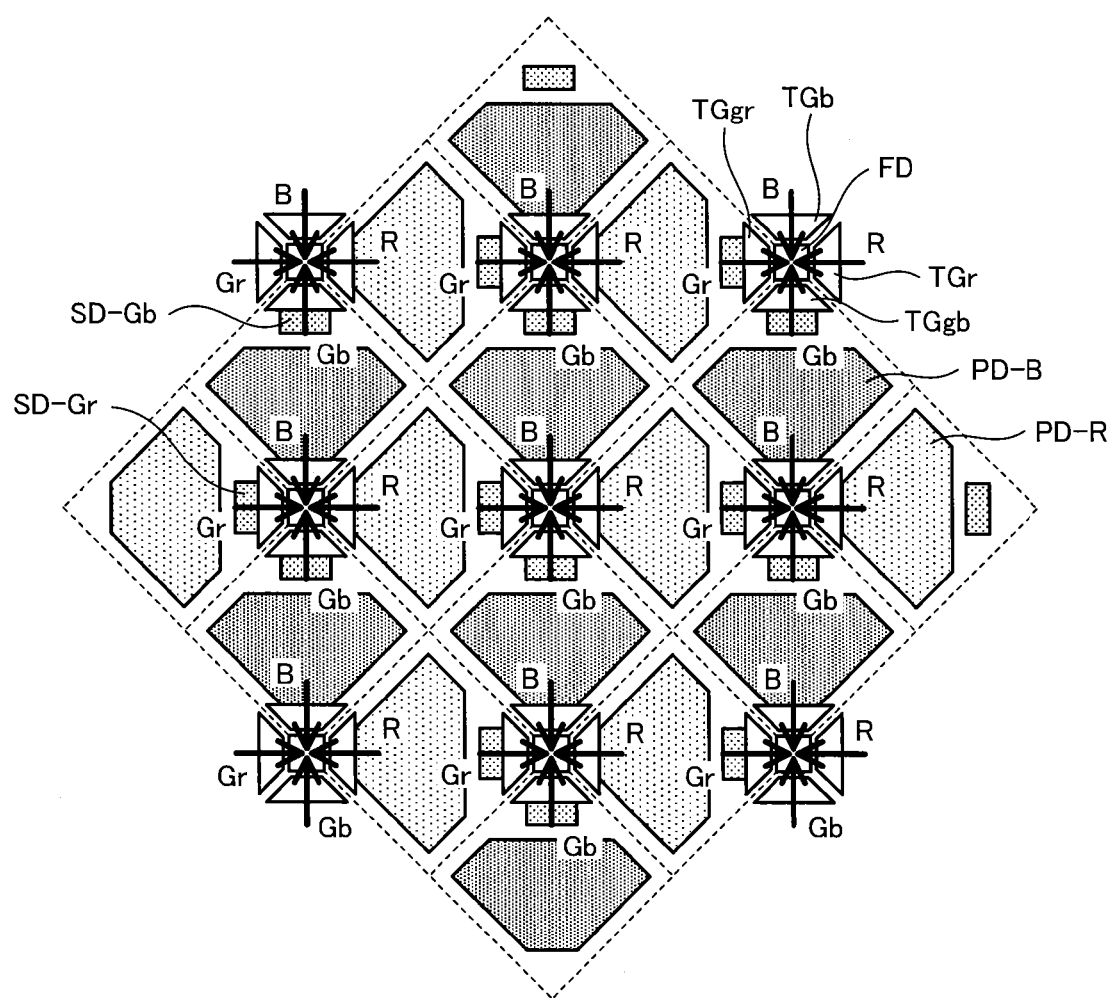
FIG. 24 is a plan view illustrating an exemplary layout of photo diodes, floating diffusion, and gate electrodes of the solid-state imaging device according to the ninth embodiment.

FIG. 24 is a plan view illustrating an exemplary layout of photo diodes, floating diffusion, and gate electrodes of the solid-state imaging device according to the ninth embodiment.

As illustrated in FIG. 13, the floating diffusion FD has been shared by two pixels located adjacent to each other in the column direction CD.

In contrast, as illustrated in FIG. 24, the floating diffusion FD is shared by four pixels located adjacent to each other both in the column direction CD and the row direction RD.

(Tenth Embodiment)

Figure 25:
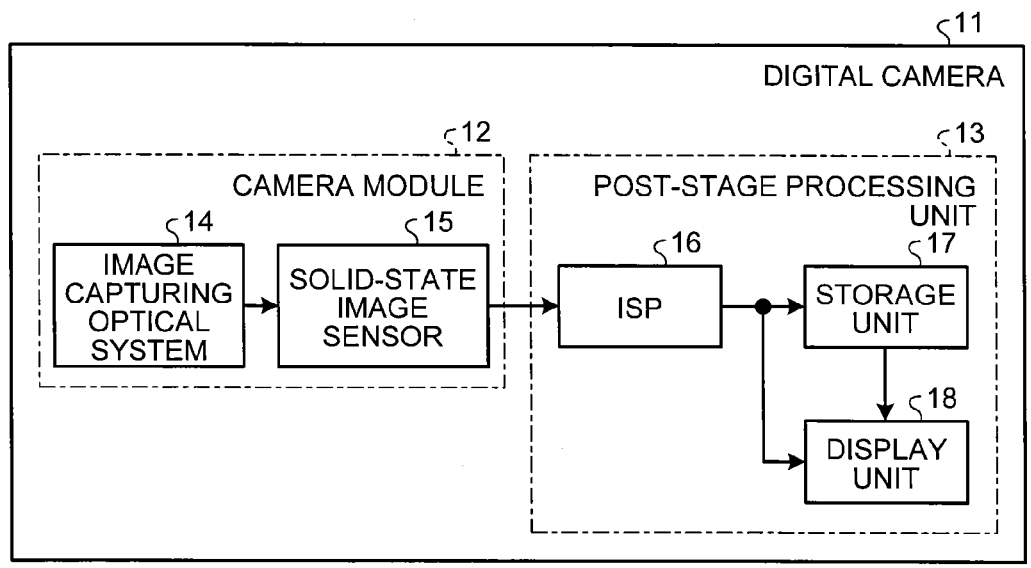
FIG. 25 is a block diagram schematically illustrating a digital camera to which a solid-state imaging device according to a tenth embodiment has been applied.

FIG. 25 is a block diagram schematically illustrating a digital camera to which a solid-state imaging device according to a tenth embodiment has been applied.

In FIG. 25, a digital camera 11 includes a camera module 12 and a post-stage processing unit 13. The camera module 12 includes an image capturing optical system 14 and a solid-state imaging device 15. The post-stage processing unit 13 includes an image signal processor (ISP) 16, a storage unit 17, and a display unit 18. The white balance unit 43, the interpolating processing unit 44, the contour enhancement unit 45, the γ correction unit 46, and the linear matrix unit 47, as illustrated in FIG. 18, may be provided in the solid-state imaging device 15 or the image signal processor 16. At least a part of the ISP 16 may be formed as a single chip with the solid-state imaging device 15.

Light from an object is captured by the image capturing optical system 14 to form an image of the object. The solid-state imaging device 15 captures an image of the object. The ISP 16 performs signal processing of an image signal obtained from the image captured by the solid-state imaging device 15. The storage unit 17 stores the image after the signal processing has been performed in the ISP 16. The storage unit 17 outputs the image signal to the display unit 18 in response to an operation or the like of a user. The display unit 18 displays an image according to the image signal entered from the ISP 16 or the storage unit 17. The display unit 18 may be, for example, a liquid crystal display. The camera module 12 may also be applied to an electronic device such as a portable terminal with camera, other than the digital camera 11.

(Eleventh Embodiment)

Figure 26:
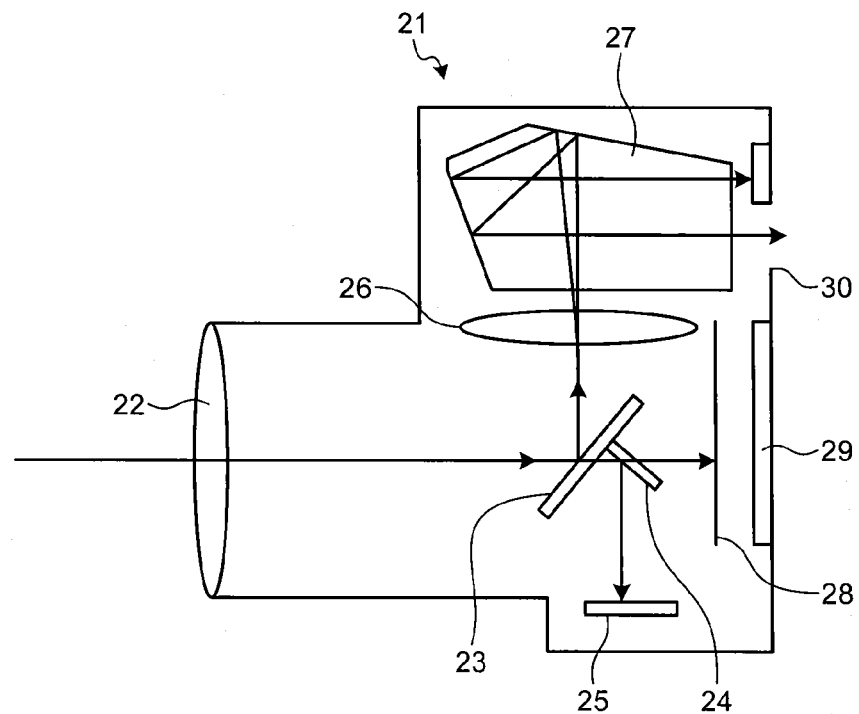
FIG. 26 is a cross-sectional view schematically illustrating the structure of a camera module to which a solid-state imaging device according to an eleventh embodiment has been applied.

FIG. 26 is a cross-sectional view schematically illustrating the structure of a camera module to which a solid-state imaging device according to an eleventh embodiment has been applied.

In FIG. 26, light from an object enters a lens 22 of a camera module 21, and proceeds to a main mirror 23, a sub-mirror 24, and a mechanical shutter 28 to reach a solid-state imaging device 29.

Light is reflected by the sub-mirror 24 and enters an auto focus (AF) sensor 25. The camera module 21 performs focus adjustment according to a detection result at the AF sensor 25. The light is reflected by the main mirror 23 and passes through a lens 26 and a prism 27 to reach a finder 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
pixels divided by a grid set diagonally to a column direction;
a green photoelectric conversion film provided for each of the pixels;
a red photoelectric conversion layer arranged to be overlapped by the green photoelectric conversion film in a depth direction; and
a blue photoelectric conversion layer arranged to be overlapped by the green photoelectric conversion film in a depth direction.

2. The solid-state imaging device according to the claim 1, wherein
the pixels are arranged two-dimensionally by shifting each line of the pixels by ½ pixel.

3. The solid-state imaging device according to the claim 2, further comprising:
an interpolating processing unit configured to interpolate pixel signals among the pixels according to pixel signals obtained from the green photoelectric conversion film.

4. The solid-state imaging device according to claim 1, wherein
the red photoelectric conversion layer and the blue photoelectric conversion layer overlap each other to spread over two pixels.

5. The solid-state imaging device according to claim 4, further comprising:
first floating diffusion shared by the green photoelectric conversion film for two pixels arranged adjacent to each other diagonally to the column direction; and
second floating diffusion shared by the blue photoelectric conversion layer and the red photoelectric conversion layer arranged adjacent to each other diagonally to the column direction.

6. The solid-state imaging device according to claim 5, wherein
the first floating diffusion and the second floating diffusion are arranged alternately and diagonally to the column direction.

7. The solid-state imaging device according to claim 1, wherein
the green photoelectric conversion film is formed by an organic photoelectric material, and the red photoelectric conversion layer and the blue photoelectric conversion layer are made of Si.

8. The solid-state imaging device according to claim 1, further comprising:
a vertical signal line configured to transfer pixel signals read from the pixels to the column direction.

9. The solid-state imaging device according to claim 1, wherein
the pixels are arranged in a checkerboard pattern diagonally to the column direction.

10. The solid-state imaging device according to claim 9, wherein
the pixels arranged in a checkerboard pattern are arranged at an angle of 45 degrees relative to the column direction.

11. The solid-state imaging device according to claim 9, wherein
the red photoelectric conversion layer and the blue photoelectric conversion layer are separately arranged in a checkerboard pattern for each of the pixels.

12. The solid-state imaging device according to claim 11, wherein
the red photoelectric conversion layer and the blue photoelectric conversion layer are arranged in a checkerboard pattern alternately for each of the pixels.

13. The solid-state imaging device according to claim 12, further comprising
first floating diffusion shared by the green photoelectric conversion film for two pixels arranged adjacent to each other diagonally to the column direction; and
second floating diffusion shared by the blue photoelectric conversion layer and the red photoelectric conversion layer arranged adjacent to each other diagonally to the column direction.

14. The solid-state imaging device according to claim 13, wherein
the first floating diffusion and the second floating diffusion are arranged alternately in the diagonal direction.

15. The solid-state imaging device according to claim 12, further comprising:
first floating diffusion shared by the green photoelectric conversion film for two pixels arranged adjacent to each other to the column direction;
second floating diffusion shared by the blue photoelectric conversion layer for two pixels arranged adjacent to each other to the column direction; and third floating diffusion shared by the red photoelectric conversion layer arranged adjacent to each other to the column direction.

16. The solid-state imaging device according to claim 15, wherein
the first floating diffusion and the second floating diffusion are arranged alternately along a first column, and
the first floating diffusion and the third floating diffusion are arranged alternately along a second column.

17. A solid-state imaging device, comprising:
a semiconductor layer;
a red photoelectric conversion layer formed in the semiconductor layer;
a blue photoelectric conversion layer formed in the semiconductor layer;
a red filter provided on the red photoelectric conversion layer;
a blue filter provided on the blue photoelectric conversion layer; and
a green photoelectric conversion film provided on the red filter and the blue filter.

18. The solid-state imaging device according to claim 17, wherein
the green photoelectric conversion film is made of an organic photoelectric conversion material.

19. The solid-state imaging device according to claim 17, further comprising:
a storage diode formed in the semiconductor layer and configured to store an electric charge that has been photoelectrically converted in the green photoelectric conversion film.

20. The solid-state imaging device according to claim 19, further comprising:
a transparent electrode attached to the green photoelectric conversion film; and
a contact plug configured to penetrate through the red filter or the blue filter to connect the transparent electrode with the storage diode.

\* \* \* \* \*